(12) United States Patent
Chang et al.

(10) Patent No.: US 12,557,630 B2
(45) Date of Patent: Feb. 17, 2026

(54) PACKAGE STRUCTURE WITH INTERPOSER ENCAPSULATED BY AN ENCAPSULANT

(71) Applicant: Advanced Semiconductor Engineering, Inc., Kaohsiung (TW)

(72) Inventors: Yung-Shun Chang, Kaohsiung (TW); Sheng-Wen Yang, Kaohsiung (TW); Teck-Chong Lee, Kaohsiung (TW); Yen-Liang Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 15 days.

(21) Appl. No.: 18/427,796

(22) Filed: Jan. 30, 2024

(65) Prior Publication Data
US 2024/0170396 A1 May 23, 2024

Related U.S. Application Data

(63) Continuation of application No. 17/555,227, filed on Dec. 17, 2021, now Pat. No. 11,887,928.

(51) Int. Cl.
*H01L 23/522* (2006.01)
*H01L 23/12* (2006.01)
*H01L 23/31* (2006.01)

(52) U.S. Cl.
CPC .......... *H01L 23/5226* (2013.01); *H01L 23/12* (2013.01); *H01L 23/31* (2013.01)

(58) Field of Classification Search
CPC .................................................. H01L 23/5226
USPC ........................................................ 257/774
See application file for complete search history.

(56) References Cited

U.S. PATENT DOCUMENTS

| | | | |
|---|---|---|---|
| 6,423,570 B1 | 7/2002 | Ma et al. | |
| 2018/0337130 A1* | 11/2018 | Chang Chien | ...... H01L 23/5383 |
| 2020/0335443 A1* | 10/2020 | Sun Zhou | ............... H01L 24/95 |
| 2021/0050327 A1 | 2/2021 | Shih | |

FOREIGN PATENT DOCUMENTS

CN 106531696 A * 3/2017 ............. H01L 21/50

OTHER PUBLICATIONS

Non-Final Office Action for U.S. Appl. No. 17/555,227, issued Jun. 23, 2023, 11 pages.
Notice of Allowance for U.S. Appl. No. 17/555,227, issued Sep. 20, 2023, 8 pages.

* cited by examiner

*Primary Examiner* — Ajay Arora
(74) *Attorney, Agent, or Firm* — FOLEY & LARDNER LLP

(57) ABSTRACT

A package structure is provided. The package structure includes an encapsulant and an interposer. The encapsulant has a top surface and a bottom surface opposite to the top surface. The interposer is encapsulated by the encapsulant. The interposer includes a main body, an interconnector, and a stop layer. The main body has a first surface and a second surface opposite to the first surface. The interconnector is disposed on the first surface and exposed from the top surface of the encapsulant. The stop layer is on the second surface, wherein a bottom surface of the stop layer is lower than the second surface.

19 Claims, 30 Drawing Sheets

PACKAGE STRUCTURE WITH INTERPOSER ENCAPSULATED BY AN ENCAPSULANT

CROSS-REFERENCE TO RELATED APPLICATION

This application is a continuation of U.S. patent application Ser. No. 17/555,227, filed Dec. 17, 2021, the content of which is incorporated herein by reference in its entirety.

BACKGROUND

1. Field of the Disclosure

The present disclosure relates to a package structure and a method for manufacturing the same.

2. Description of the Related Art

Currently, through silicon vias (TSVs) in bridge dice are used to improve power delivery efficiency by reducing the power supply path. However, when solders (e.g., AuSn solder, AgSn solder, PbSn solder) are used for electrically connecting to the TSVs, the relatively high electrical resistance of the solders is disadvantageous to the power transmission performance.

SUMMARY

In some embodiments, a package structure includes an encapsulant and an interposer. The encapsulant has a top surface and a bottom surface opposite to the top surface. The interposer is encapsulated by the encapsulant. The interposer includes a main body, an interconnector, and a stop layer. The main body has a first surface and a second surface opposite to the first surface. The interconnector is disposed on the first surface and exposed from the top surface of the encapsulant. The stop layer is on the second surface, and a bottom surface of the stop layer is lower than the second surface.

In some embodiments, a package structure includes an encapsulant and an interposer. The interposer is encapsulated by the encapsulant. The interposer includes a main body, a conductive through via, an interconnector, and a pad. The main body has a first surface and a second surface opposite to the first surface. The conductive through via is in the main body, and the conductive through via includes a first end adjacent to the first surface and a second end adjacent to the second surface. The interconnector is disposed on the first surface and electrically connected to the first end. The pad is adjacent to the second end and configured to receive heat generated from the conductive through via.

In some embodiments, a package structure includes an encapsulant, a first bridge interposer, and a dielectric layer. The first bridge interposer is encapsulated by the encapsulant. The first bridge interposer includes a main body, a conductive through via, an interconnector, and a first pad. The main body has a top surface and a bottom surface opposite to the top surface. The conductive through via is in the main body, and the conductive through via includes a top end adjacent to the top surface and a bottom end opposite to the top end and adjacent to the bottom surface. The interconnector is disposed on the top surface and electrically connected to the conductive through via. The first pad is adjacent to the bottom surface and electrically connected to the conductive through via. The dielectric layer is disposed on the bottom surface and includes an opening to expose an area of the first pad. A center of the area is misaligned with a center of the bottom end of the conductive through via.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
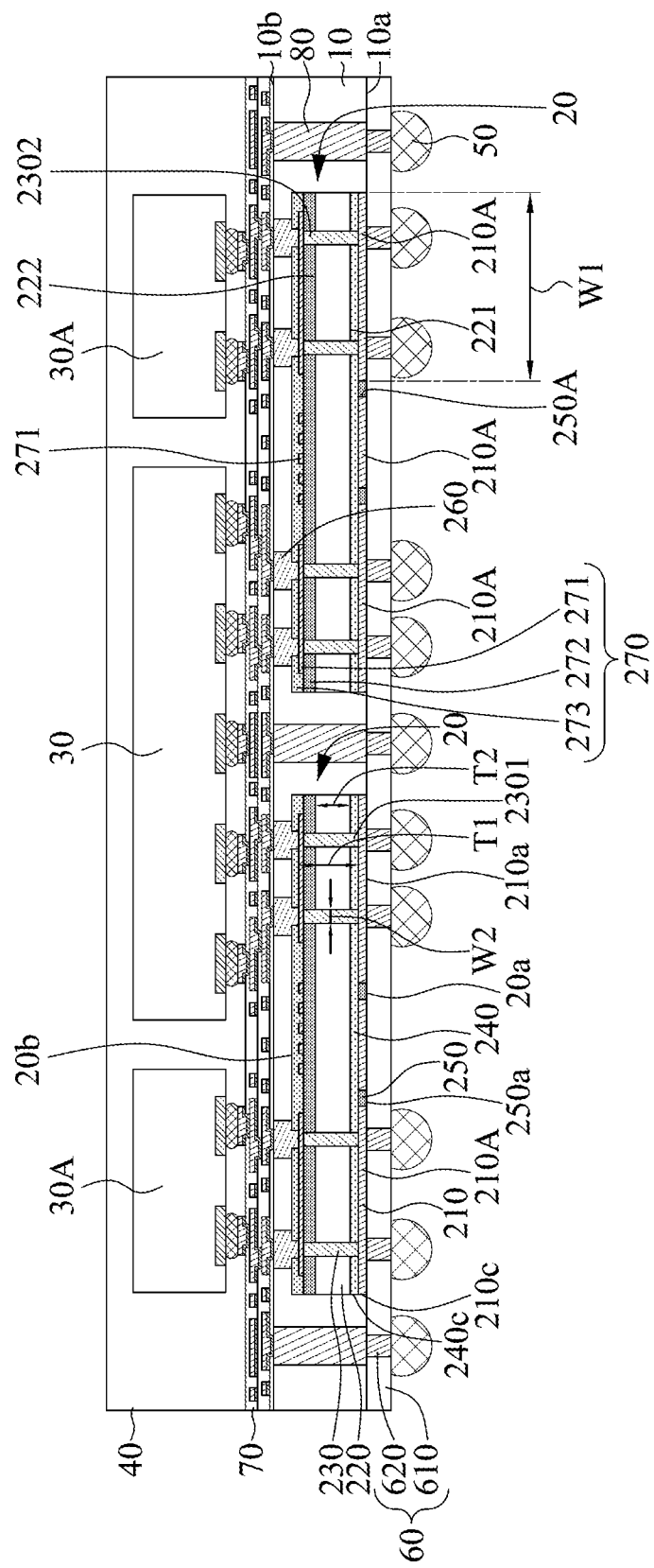
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a package structure 1 according to some embodiments of the present disclosure. The package structure 1 includes encapsulants 10 and 40, one or more interposers 20, electronic components 30 and 30A, electrical contacts 50, conductive structures 60 and 70, and conductive elements 80.

The encapsulant 10 has a surface 10a (also referred to as "a bottom surface") and a surface 10b (also referred to as "a top surface") opposite to the surface 10a. The encapsulant 10 may include an epoxy resin having fillers, a molding compound (e.g., an epoxy molding compound or other molding compound), polyimide, a phenolic compound or material, a material with a silicone dispersed therein, or a combination thereof.

The interposers 20 may be encapsulated by the encapsulant 10. In some embodiments, the interposer 20 is embedded in the encapsulant 10. The interposer 20 has a surface 20a (also referred to as "a bottom surface") and a surface 20b (also referred to as "a top surface") opposite to the surface 20a. A portion of the encapsulant 10 covers and contacts the surface 20b (also referred to as "a top surface") of the interposers 20. In some embodiments, at least one of the interposers 20 is disposed adjacent to a side of another one of the interposers 20.

In some embodiments, the interposer 20 (also referred to as "the bridge interposer") is configured to transmit an electrical signal between the electronic components 30 and/ or 30A. In some embodiments, the interposer 20 is configured to connect the electronic components 30 and/or 30A to receive power or be grounded. In some embodiments, the interposer 20 includes a stop layer 210, a main body 220, one or more conductive through vias 230, a buffer layer (e.g., a combination of dielectric layers 240 and 250), interconnectors 260, and a conductive structure 270. In some embodiments, the interposer 20 may be or include a bridge die. In some embodiments, the package structure 1 includes a plurality of the interposers 20. In some embodiments, two adjacent interposers 20 may be arranged side-by-side. For example, one interposer (also referred to as "a first interposer" or "a first bridge interposer") may be disposed adjacent to a side of an adjacent interposer 20 (also referred to as "a second interposer" or "a second bridge interposer"). In some embodiments, bottom surfaces of the stop layers 210 of the two adjacent interposers 20 are substantially aligned with each other.

The main body 220 may be embedded in the encapsulant 10. The main body 220 may be or include silicon. In some embodiments, the main body 220 may have a first surface 222 (also referred to as "a top surface") and a second surface 221 (also referred to as "a bottom surface") opposite to the first surface 222. The second surface 221 of the main body 220 may be misaligned with the surface 10a of the encapsulant 10. For example, the second surface 221 of the main body 220 may be not coplanar with the surface 10a of the encapsulant 10, and there may be a gap between the second surface 221 of the main body 220 and the surface 10a of the encapsulant 10.

The dielectric layer 240 may be also referred to as "a first dielectric layer", and may be disposed on the second surface 221 of the main body 220. The dielectric layer 240 may be an interlayer dielectric (ILD) layer or a passivation layer. In some embodiments, a lateral surface 240c of the dielectric layer 240 is substantially aligned with or coplanar with a lateral surface 210c of the stop layer 210. The dielectric layer 250 may be also referred to as "a second dielectric layer", and may be disposed on the dielectric layer 240. In some embodiments, the dielectric layers 240 and 250 are disposed on the surface 221 of the main body 220. The dielectric layers 240 and 250 may include the same or different materials. In some embodiments, the dielectric layer 250 may include, or be formed from, a photoresist layer, a passivation layer, a cured photo sensitive material, a cured photoimageable dielectric (PID) material such as epoxy, polypropylene (PP), or polyimide (PI) including photoinitiators, or a combination of two or more thereof. The dielectric layer 250 may include a first surface 250a (or the bottom surface). The first surface 250a (or the bottom surface) of the dielectric layer 250 may be the surface 20a (also referred to as "a bottom surface") of the interposer 20.

In some embodiments, the stop layer 210 may be disposed on the dielectric layer 240 and may be embedded in the dielectric layer 250. The stop layer 210 may include a first surface 210a (or the bottom surface). In some embodiments, the first surface 250a (or the bottom surface) of the dielectric layer 250 is substantially aligned with or coplanar with the first surface 210a (or the bottom surface) of the stop layer 210. Thus, the stop layer 210 may be exposed from the surface 20a (also referred to as "a bottom surface") of the interposer 20. In some embodiments, the surface 210a (also referred to as "a bottom surface") of the stop layer 210 may be exposed from the first surface 20a (or the bottom surface) of the interposer 20. In some embodiments, the stop layer 210 may be disposed on the second surface 221 (also referred to as "a bottom surface") of the main body 220. In some embodiments, the first surface 210a (or the bottom surface) of the stop layer 210 is substantially aligned with or coplanar with the surface 10a (or the bottom surface) of the encapsulant 10. In some embodiments, the encapsulant 10 contacts the lateral surface 210c of the stop layer 210. In some embodiments, an elevation of the bottom surface 10a of the encapsulant 10 is lower than an elevation of the second surface 221 of the main body 20. In some embodiments, a bottom surface 10a of the stop layer 210 is lower than the second surface 221 of the main body 220. In some embodiments, a gap is between the stop layer 210 and the second surface 221 of the main body 220. In some embodiments, a buffer layer (e.g., the dielectric layer 240 and/or the dielectric layer 250) is disposed in the gap. In some embodiments, the buffer layer is disposed between the encapsulant 10 and the stop layer 210. In some embodiments, the stop layer 210 has a top surface which is opposite to the bottom surface 210a and facing the buffer layer, and the buffer layer further encapsulates the top surface and the lateral surface 210c of the stop layer 210. In some embodiments, the bottom surface 210a is exposed from the encapsulant 10. In some embodiments, the lateral surface 210c extends from the bottom surface 210a and contacts the encapsulant 10. In some embodiments, the bottom surfaces 210a of the stop layers 210 of two adjacent interposers 20 are substantially aligned with each other.

The conductive structure 270 may include a conductive layer 271 (also referred to as "a circuit layer"), a first passivation layer 272 and a second passivation layer 273. The first passivation layer 272 may be disposed on the first surface 222 of the main body 220. The conductive layer 271 may be disposed on the first passivation layer 272. The second passivation layer 273 may cover the conductive layer 271 and the first passivation layer 272. The first passivation layer 272 and the second passivation layer 273 may include the same or different materials. For example, the first passivation layer 272 and the second passivation layer 273 may include nitride or oxide. In some embodiments, the interconnectors 260 may extend through the second passivation layer 273 to electrically connect the conductive structure 70 and the conductive layer 271 of the conductive structure 270. In some embodiments, the interconnectors 260 are disposed on the first surface 222 and exposed from the top surface 10b of the encapsulant 10. In some embodiments, the interconnectors 260 may be or include conductive pillars and/or conductive studs.

The conductive through vias 230 may be in the main body 220. In some embodiments, the conductive through via 230 extends through the main body 220. In some embodiments, the conductive through via 230 may include a second end 2301 (also referred to as "a bottom end") exposing from or protruding from the second surface 221 of the main body 220 and a first end 2302 (also referred to as "a top end") exposing from or protruding from the first surface 222 of the main body 220. In some embodiments, the first end 2302 is adjacent to the first surface 222, and the second end 2301 is adjacent to the second surface 221. In some embodiments, the first end 2302 is electrically connected to the interconnector 260. In some embodiments, the dielectric layer 250 includes an opening 250A to expose an area of the stop layer 210. In some embodiments, a center of the exposed area of the stop layer 210 is misaligned with a center of the second end 2301. In some embodiments, a diameter of the exposed area of the stop layer 210 is greater than a diameter of a bottom end 2301 the conductive through via 230 from a top view perspective. In some embodiments, a center of the surface 210a of the stop layer 210 is misaligned with the center of the second end 2301 of the conductive through via 230 from a top view perspective. In some embodiments, the stop layer 210 is free from overlapping the conductive through via 230 from the top view perspective. In some embodiments, the dielectric layer 250 includes a plurality of openings 250A to expose a plurality of areas of the stop layer 210, respectively. In some embodiments, a pitch between the areas is greater than a pitch between the conductive through vias 230. In some embodiments, the second end 2301 of the conductive through via 230 may extend through the dielectric layer 240 to contact the stop layer 210, and the first end 2302 of the conductive through via 230 may extend through the first passivation layer 272 to contact the conductive layer 271. In some embodiments, the second end 2301 of the conductive through via 230 is disposed within an opening of the dielectric layer 240, and the first end 2302 of the conductive through via 230 is disposed within an opening of the first passivation layer 272. Thus, the conductive through via 230 may be electrically connected to the stop layer 210 and the conductive structure 270. The conductive through vias 230 may be through silicon vias (TSVs). In some embodiments, the conductive through via 230 is configured to receive or transmit a power. In some embodiments, the stop layer 210 may be configured to prevent damage to the interposer 20 (e.g., the main body 220 and the conductive through vias 230) during a grinding operation. The grinding operation may be performed with a slurry having a relatively large grain size and on a relatively large area (e.g., on the surface 10a of the encapsulant 10). According to some embodiments of the present disclosure, the conductive through vias 230 and/or elements/components within the main body 220 can be protected from damages during the grinding operation with the arrangement of the stop layer 210. In addition, cracks of the interposer 20 (e.g., the main body 220) which could have been caused by the grinding operation can be mitigated or prevented.

The stop layer 210 may include one or more conductive pads 210A adjacent to the second end 2301. The conductive pads 210A of the stop layer 210 may contact the second end 2301 of the conductive through via 230. In some embodiments, a pitch between the conductive pads 210A is greater than a pitch between the conductive through vias 230. In some embodiments, the one or more conductive pads 210A of the stop layer 210 are configured to receive heat generated from the conductive through via 230. In some embodiments, a thermal conductivity of the stop layer 210 (or one or more conductive pads 210A of the stop layer 210) is greater than a thermal conductivity of the main body 220. In some embodiments, a heat transfer coefficient of the stop layer 210 is higher than a heat transfer coefficient of the encapsulant 10. In some embodiments, the stop layer 210 may be or include a heat conductor. According to some embodiments of the present disclosure, the stop layer 210 serving as a heat conductor can improve the heat dissipation of the package structure 1, and thus the delamination resulted from the deformation caused by uninform heat distribution can be mitigated or prevented. In some embodiments, the stop layer 210 includes a conductive material such as a metal or metal alloy. Examples include gold (Au), silver (Ag), aluminum (Al), copper (Cu), or an alloy thereof. In some embodiments, the stop layer 210 may be or include an interconnector.

In some embodiments, a width W1 of the stop layer 210 (or the conductive pads 210A) is greater than a width W2 of the conductive through via 230. In some embodiments, the width W1 of the conductive pad 210A of the stop layer 210 is from about 20 μm to about 30 μm. In some embodiments, the width W2 of the conductive through via 230 is from about 6 μm to about 10 μm, or about 8 μm. In some embodiments, the stop layer 210 is or includes an interconnector which is electrically connected to the conductive through via 230. For example, the stop layer 210 (or the interconnector) electrically connects the conductive through via 230 to the conductive structure 60. In some embodiments, the conductive through via 230 contacts the stop layer 210 (or the interconnector) directly. In some embodiments, a length T1 of the conductive through via 230 is greater than a thickness T2 of the main body 220. In some embodiments, a vertical projection of the conductive through vias 230 is within a vertical projection of the conductive pad 210A of the stop layer 210. In some embodiments, two or more conductive through vias 230 may be connected to a same conductive pad 210A to electrically connect to receive power. In some embodiments, one conductive through via 230 is connected to one corresponding conductive pad 210A to electrically connect to ground or other terminals.

While the width W2 of the conductive through via 230 is relatively small, it is difficult to directly connect the conductive through via 230 to a solder joint structure (e.g., solder balls). According to some embodiments of the present disclosure, the stop layer 210 has a relatively large width or dimension and thus can serve as an interconnector for the conductive through via 230, and thus the processing window (or tolerance) can be enlarged as well. Therefore, the tolerance in ranges of shifts between the conductive through via 230 and the corresponding stop layer 210 (e.g., the conductive pad 210A) can be increased while the conductive through via 230 and the stop layer 210 can remain in electrical contact, which can further increase the manufacturing yield. In addition, according to some embodiments of the present disclosure, with the arrangement of the stop layer 210 (or the interconnector), the width of the electrical path from the conductive through via 230 towards the conductive structure 60 can be enlarged, and thus the electrical resistance of the electrical path can be reduced, which is advantageous to the electronic performance of the package structure 1.

The electronic components 30 and 30A may be disposed outside of the encapsulant 10. In some embodiments, the electronic components 30 and 30A are disposed over and electrically connected to the interposer 20. In some embodiments, the electronic component 30 is electrically connected to the electronic component 30A through the interposer 20 (or the bridge interposer). In some embodiments, the electronic components 30 and 30A are electrically connected to the interposer 20 through the conductive structure 70. The electronic components 30 and 30A may include different components. The electronic component 30 may be or include a processing element such as an application specific integrated circuit (ASIC) die, and the electronic component 30A may be or include a storage element as a high bandwidth memory (HBM) die.

The encapsulant 40 may encapsulate the electronic components 30 and 30A. In some embodiments, the encapsulant 40 is spaced apart from the encapsulant 10. The encapsulant 40 may include an epoxy resin having fillers, a molding compound (e.g., an epoxy molding compound or other molding compound), polyimide, a phenolic compound or material, a material with a silicone dispersed therein, or a combination thereof. The encapsulant 40 and the encapsulant 10 may include the same or different materials.

The electrical contacts 50 may electrically connect to the interposer 20. In some embodiments, a vertical projection of the conductive through vias 230 is within a vertical projection of one of the electrical contacts 50. In some embodiments, the electrical contact 50 includes a controlled collapse chip connection (C4) bump, a ball grid array (BGA), or a land grid array (LGA).

The conductive structure 60 may be between the stop layer 210 and the electrical contacts 50. In some embodiments, the conductive structure 60 electrically connects to the stop layer 210 (or the interconnector). In some embodiments, the electrical contacts 50 electrically connect to the conductive structure 60. In some embodiments, the conductive structure 60 includes a dielectric layer 610 and a plurality of conductive elements 620 within the dielectric layer 610. The conductive element 620 may be a conductive pillar or a conductive stud.

The conductive structure 70 may be between the interposer 20 and the electronic components 30 and 30A. In some embodiments, the conductive structure 70 electrically connects to the electronic components 30 and 30A. In some embodiments, the interposer 20 electrically connects to the conductive structure 70. The conductive structure 70 may be a redistribution structure or a wiring structure, and may include a plurality of dielectric layers, at least one circuit layer and a plurality of inner vias electrically connected to the circuit layer. The circuit layer may be a redistribution layer, and may include a seed layer and a metallic layer disposed on the seed layer. The inner via may taper toward the interposer 20. That is, a width of the inner via may decrease toward the interposer 20.

The conductive element 80 may be a conductive through via or a conductive pillar. The conductive element 80 may extend through the encapsulant 10 and may be disposed around the interposer 20. In some embodiments, the conductive element 80 includes a through mold via (TMV). In some embodiments, the conductive element 80 electrically connects the conductive structure 60 and the conductive structure 70. A top surface of the conductive element 80 may be aligned with or coplanar with the surface 10b (also referred to as "a top surface") of the encapsulant 10, and a bottom surface of the conductive element 80 may be aligned with or coplanar with the surface 10a (also referred to as "a bottom surface") of the encapsulant 10. A width of the conductive element 80 may be greater than the width W2 of the conductive through via 230.

Figure 1A:
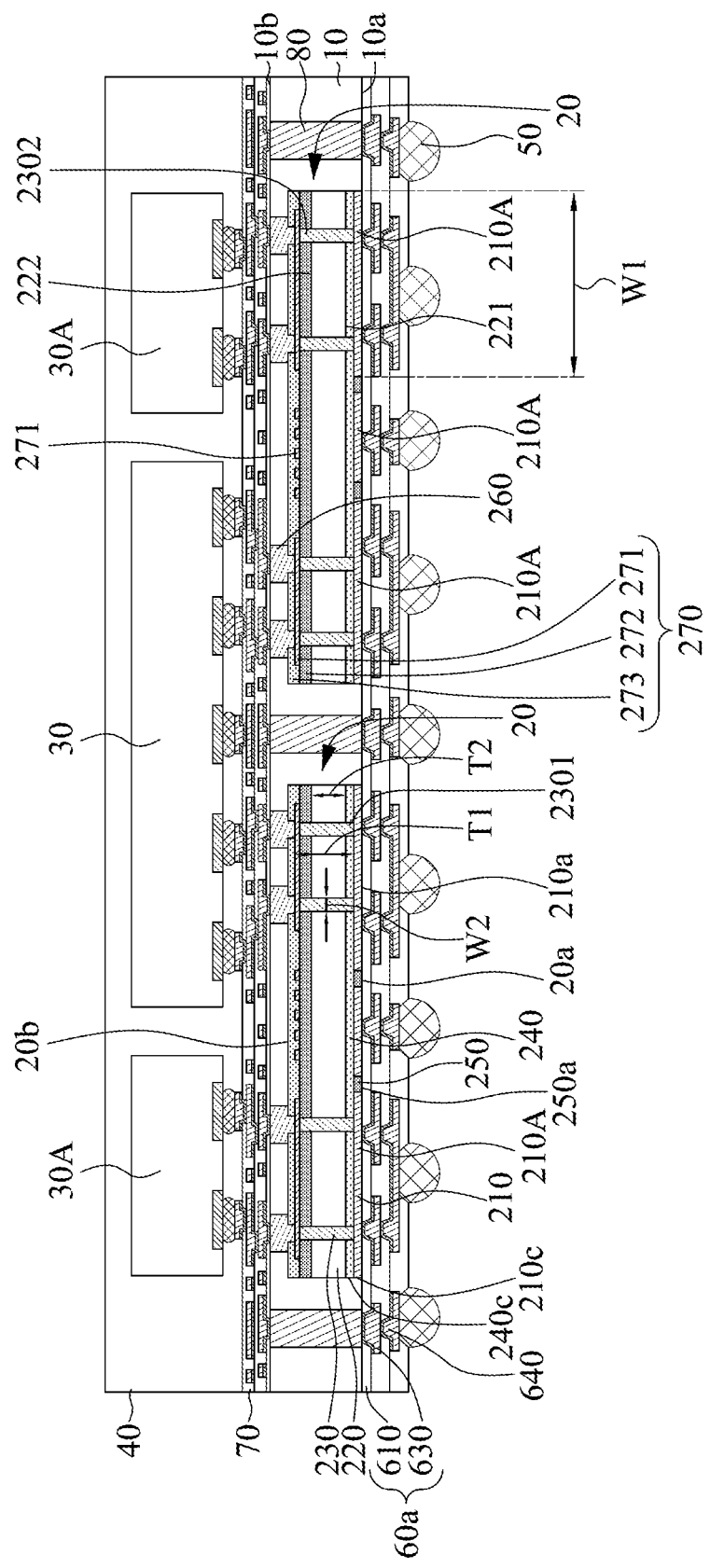
FIG. 1A illustrates a cross-sectional view of a package structure according to some embodiments of the present disclosure.

FIG. 1A illustrates a cross-sectional view of a package structure 1A according to some embodiments of the present disclosure. The package structure 1A is similar to the package structure 1 in FIG. 1, except for a structure of the conductive structure 60a.

In some embodiments, the conductive structure 60a includes a redistribution structure or a wiring structure. In some embodiments, the conductive structure 60a includes at least one dielectric layer 610, at least one circuit layer 630 in contact with or interposed between the dielectric layers 610, and a plurality of inner vias 640 embedded in the dielectric layers 610. The inner via 640 may taper toward the interposer 20. Thus, a tapering direction of the inner via 640 of the conductive structure 60a may be different from a tapering direction of the inner via of the conductive structure 70.

Figure 1B:
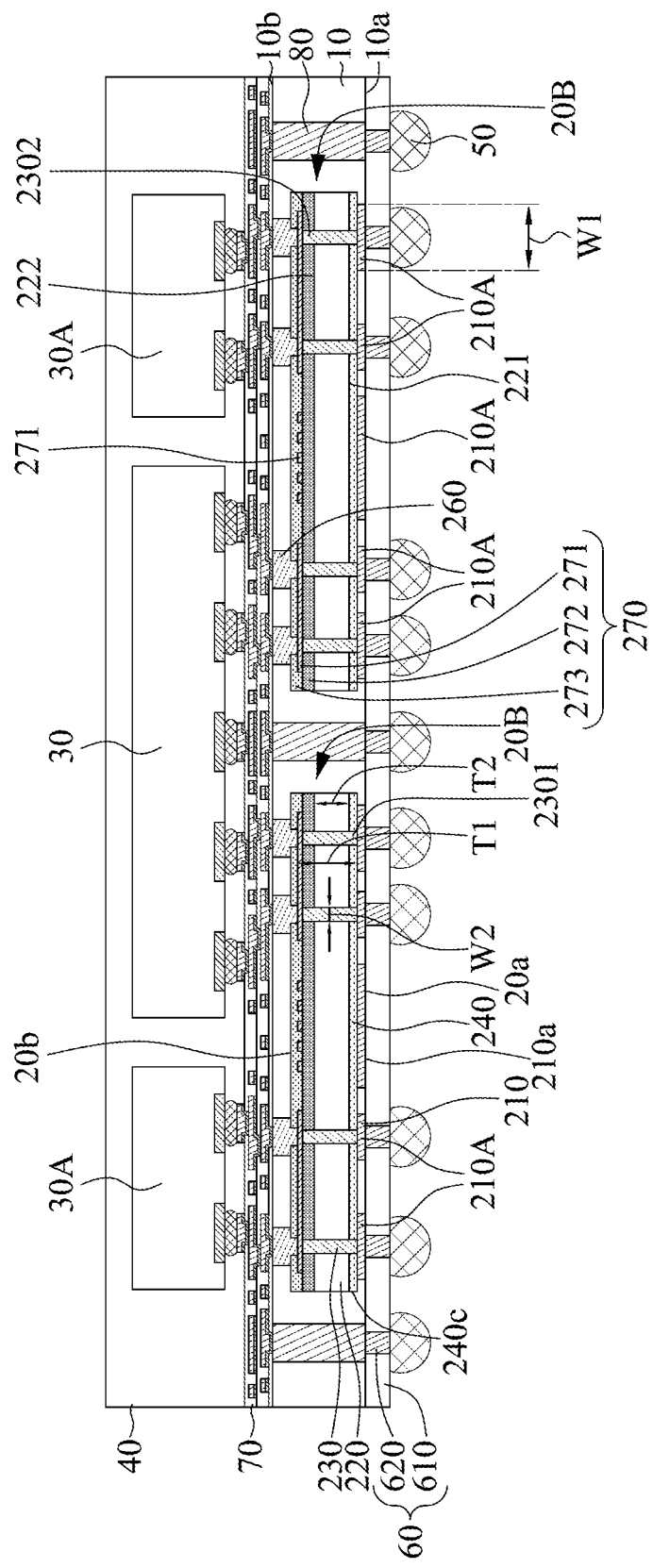
FIG. 1B illustrates a cross-sectional view of a package structure according to some embodiments of the present disclosure.

FIG. 1B illustrates a cross-sectional view of a package structure 1B according to some embodiments of the present disclosure. The package structure 1B is similar to the package structure 1 in FIG. 1, except for a structure of the interposer 20B.

In the interposer 20B of FIG. 1B, the dielectric layer 250 of the interposer 20 of FIG. 1 may be omitted. In some embodiments, a center of the conductive pad 210A of the stop layer 210 (or the interconnector) is substantially aligned with a center of the second end 2301 of the conductive through via 230. In some embodiments, the center of the conductive pad 210A of the stop layer 210 (or the interconnector) is substantially aligned with a center of one of the electrical contacts 50. In some embodiments, the encapsulant 10 further extends between the conductive pads 210A (or conductor portions) of the stop layer 210 (or the heat conductor). A portion of the encapsulant 10 may be disposed between the conductive structure 60 and the dielectric layer 240 of the interposer 20B.

Figure 1C:
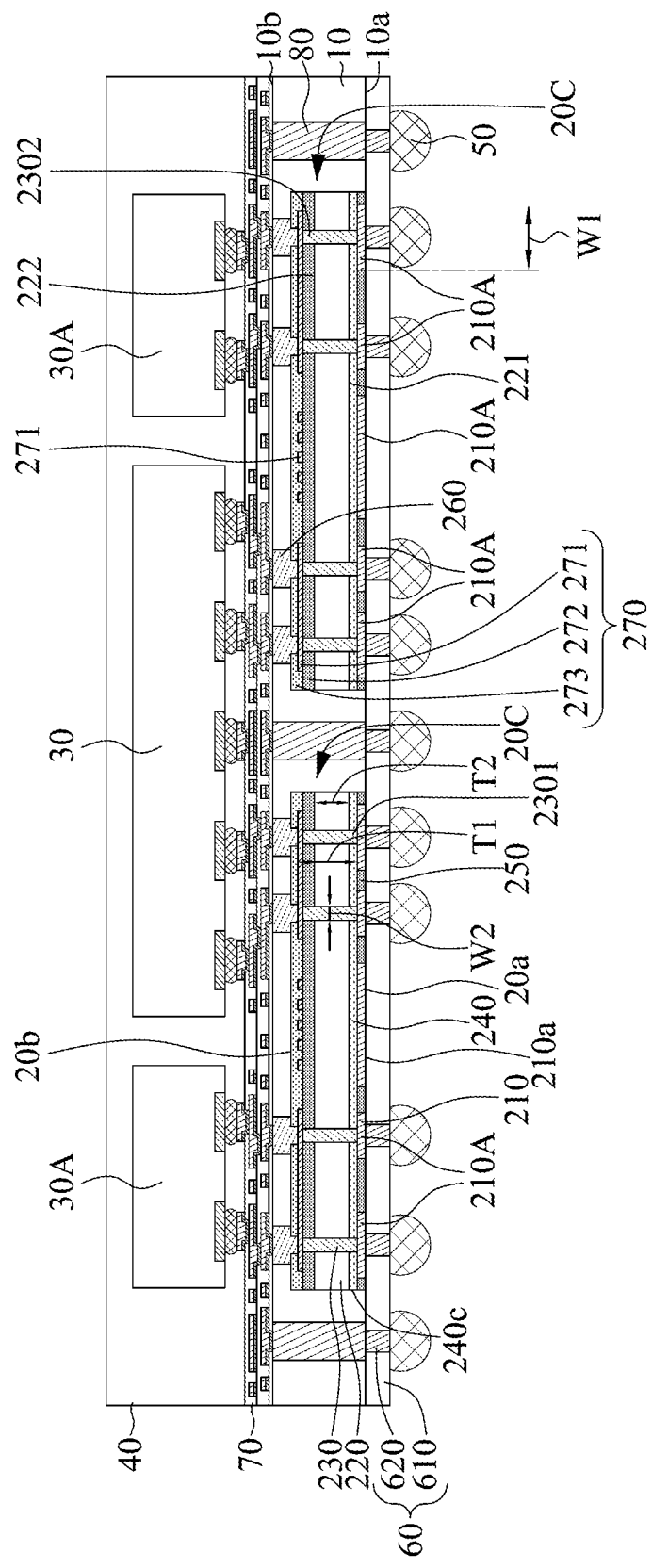
FIG. 1C illustrates a cross-sectional view of a package structure according to some embodiments of the present disclosure.

FIG. 1C illustrates a cross-sectional view of a package structure 1C according to some embodiments of the present disclosure. The package structure 1C is similar to the package structure 1 in FIG. 1, except for a structure of the interposer 20C.

In some embodiments, a lateral surface of the dielectric layer 250 is substantially aligned with a lateral surface of the main body 220. In some embodiments, the dielectric layer 250 is between the pads 210A of the stop layer 210, and covers the lateral surface 210c of the stop layer 210.

Figure 1D:
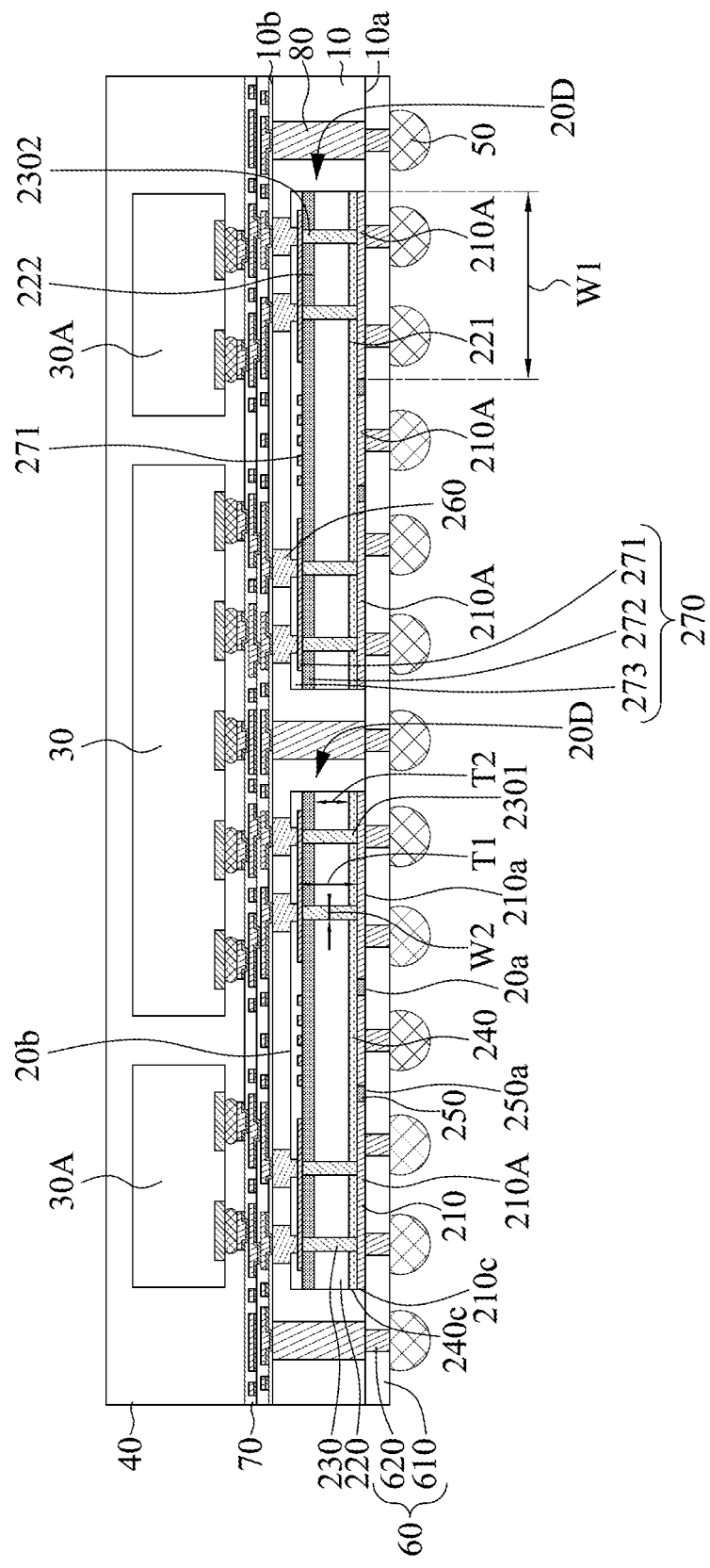
FIG. 1D illustrates a cross-sectional view of a package structure according to some embodiments of the present disclosure.

FIG. 1D illustrates a cross-sectional view of a package structure 1D according to some embodiments of the present disclosure. The package structure 1C is similar to the package structure 1 in FIG. 1, except for structures of the interposer 20C and the electrical contacts 50.

In some embodiments, a pitch between the electrical contacts 50 is uniform. For example, a pitch between two adjacent electrical contacts 50 is substantially the same as a pitch between another two adjacent electrical contacts 50. In some embodiments, the stop layer 210 may serve as a RDL. In some embodiments, some of the conductive elements 620 of the conductive structure 60 may be misaligned with the conductive through via 230. The stop layer 210 may be a fan-in structure.

Figure 1E:
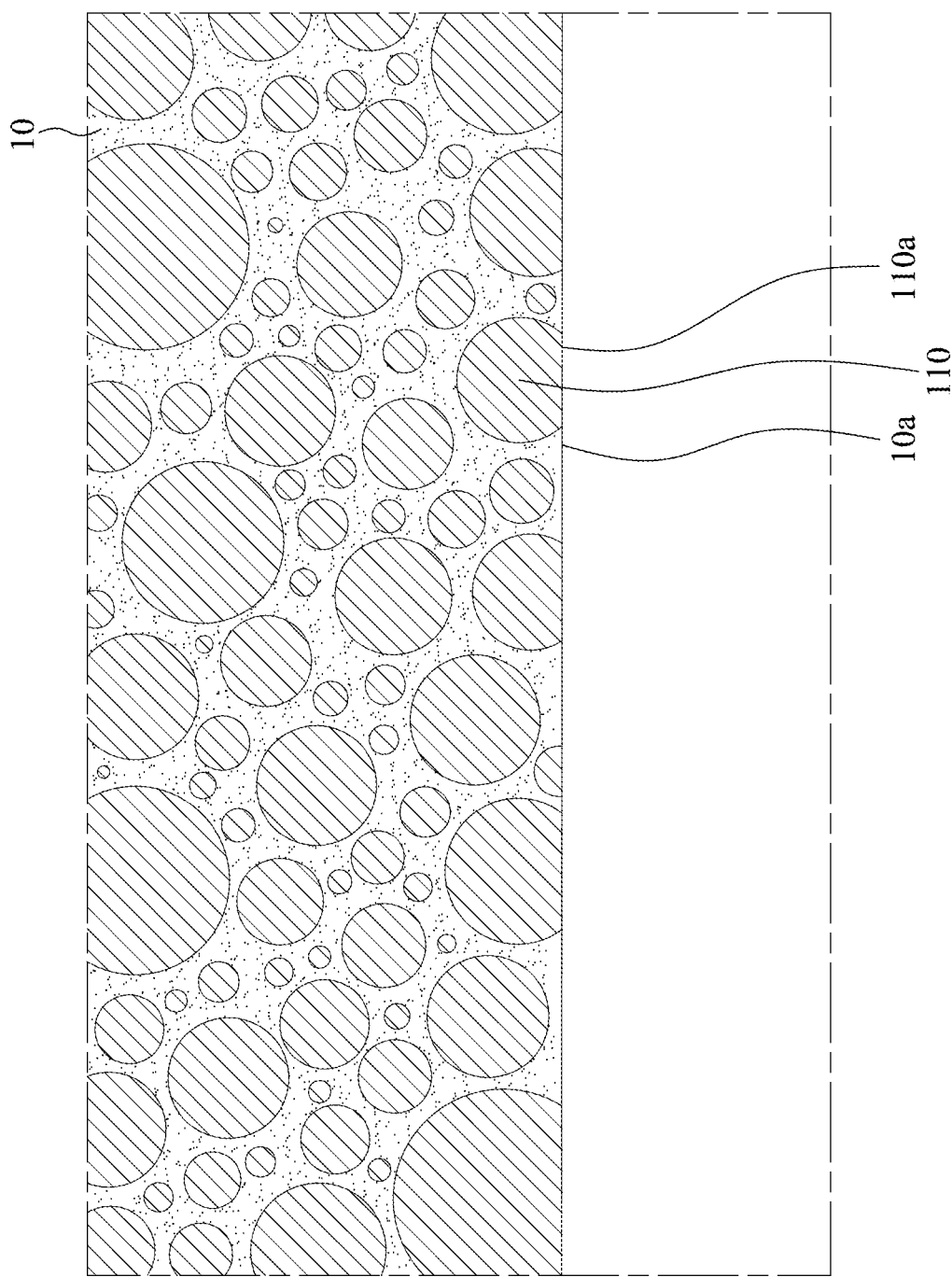
FIG. 1E illustrates a cross-sectional view of a portion of a package structure 1 according to some embodiments of the present disclosure.

FIG. 1E illustrates a cross-sectional view of a portion of a package structure 1 according to some embodiments of the present disclosure. For example, FIG. 1E may illustrate a cross-sectional view of a portion of the package structure 1 (FIG. 1), the package structure 1A (FIG. 1A), the package structure 1B (FIG. 1B), the package structure 1C (FIG. 1C), or the package structure 1D (FIG. 1D).

In some embodiments, the encapsulant 10 include one or more fillers 110. In some embodiments, the filler 110 has a truncated surface 110a substantially aligned with the bottom surface 10a of the encapsulant 10.

Figure 2A:
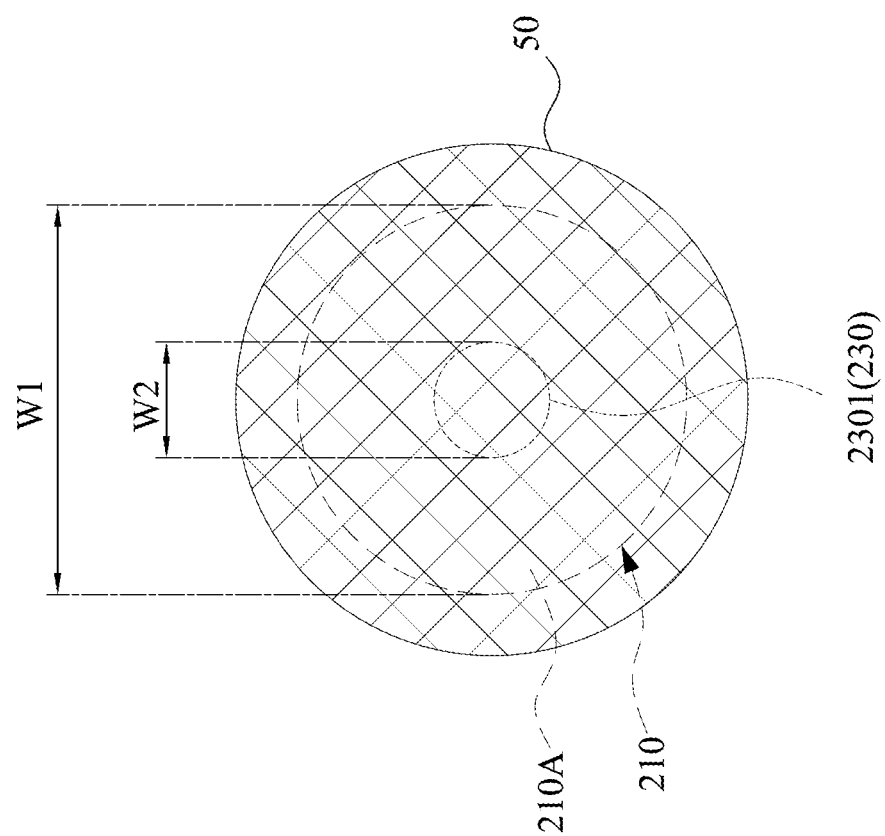
FIG. 2A illustrates a bottom view of a portion of a package structure according to some embodiments of the present disclosure.

FIG. 2A illustrates a bottom view of a portion of a package structure according to some embodiments of the present disclosure. For example, FIG. 2A may illustrate a bottom view of a portion including a conductive pad 210A, a conductive through via 230, and an electrical contact 50 of the package structure 1B of FIG. 1B. For example, FIG. 2A may also illustrate a bottom view of a portion including a conductive pad 210A, a conductive through via 230, and an electrical contact 50 of the package structure 1 (FIG. 1) or the package structure 1A (FIG. 1A).

In some embodiments, a center of the conductive pad 210A of the stop layer 210 is substantially aligned with a center of the second end 2301 of the conductive through via 230. In some embodiments, the center of the conductive pad 210A of the stop layer 210 is substantially aligned with a center of the electrical contact 50.

Figure 2B:
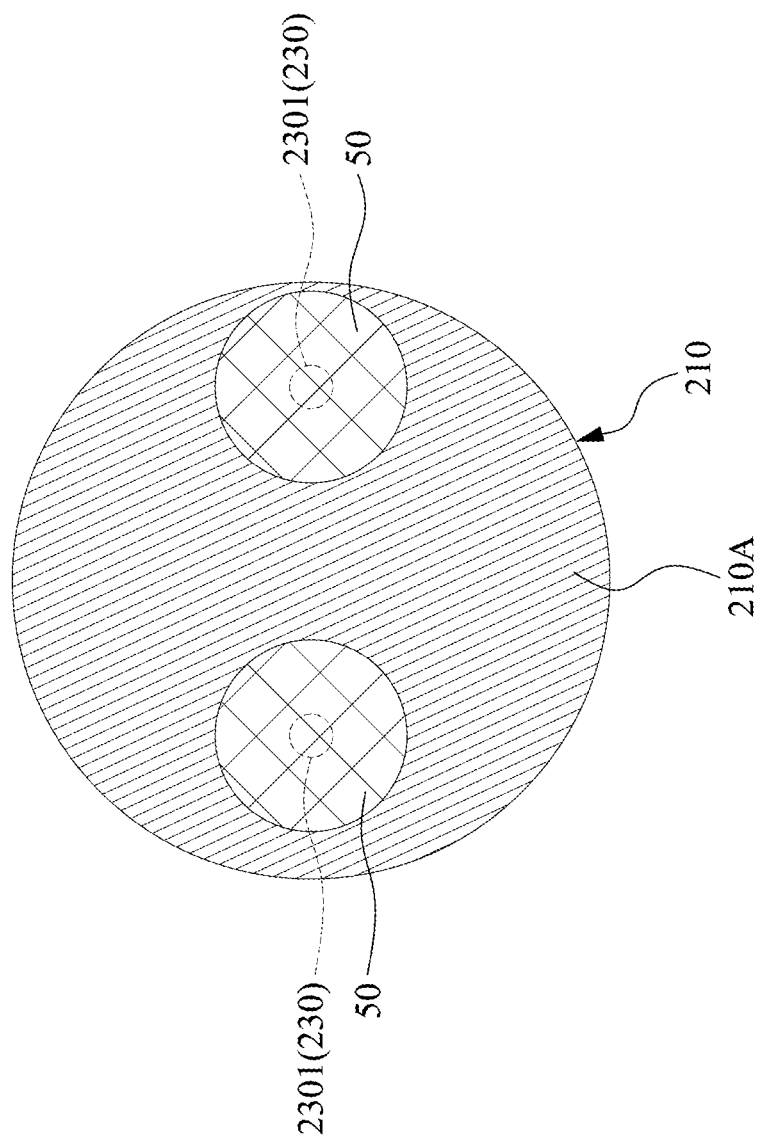
FIG. 2B illustrates a bottom view of a portion of a package structure according to some embodiments of the present disclosure.

FIG. 2B illustrates a bottom view of a portion of a package structure according to some embodiments of the present disclosure. For example, FIG. 2B may illustrate a bottom view of a portion including a conductive pad 210A, two conductive through vias 230, and two electrical contacts 50 of the package structure 1 (FIG. 1) or the package structure 1A (FIG. 1A). For example, FIG. 2B may also illustrate a bottom view of a portion including a conductive pad 210A, two conductive through vias 230, and an electrical contact 50 of the package structure 1B (FIG. 1B).

In some embodiments, a vertical projection of two or more conductive through vias 230 is within a vertical projection of the conductive pad 210A. In some embodiments, a vertical projection of two or more conductive through vias 230 is within a vertical projection of one of the electrical contacts 50.

Figure 2C:
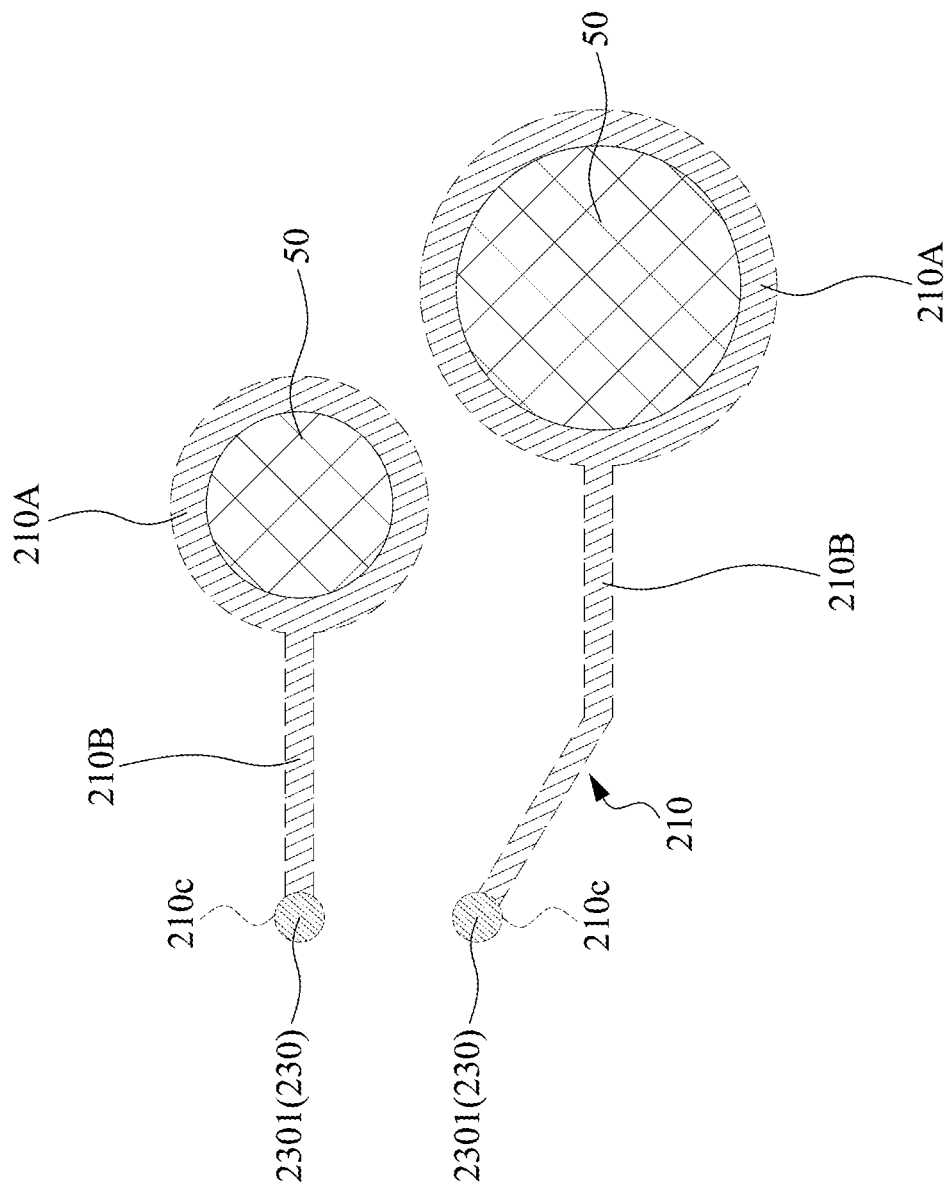
FIG. 2C illustrates a bottom view of a portion of a package structure according to some embodiments of the present disclosure.

FIG. 2C illustrates a bottom view of a portion of a package structure according to some embodiments of the present disclosure. For example, FIG. 2C may illustrate a bottom view of a portion including two or more conductive pads 210A, two or more conductive through vias 230, and two or more electrical contacts 50 of the package structure 1, (FIG. 1), the package structure 1A (FIG. 1A) or the package structure 1B (FIG. 1B).

In some embodiments, the conductive pad 210A of the stop layer 210 is misaligned with a center of the second end 2301 of the conductive through via 230. In some embodiments, the electrical contact 50 is misaligned with a center of the second end 2301 of the conductive through via 230. In some embodiments, the stop layer 210 further includes one or more conductive pads 210C and one or more conductive traces 210B. The conductive trace 210B may connect the conductive pad 210A and the conductive pad 210C. The second end 2301 of the conductive through via 230 may contact the conductive pad 210C. The electrical contact 50 may be aligned with and electrically connected to the conductive pad 210A. Thus, the conductive trace 210B may electrically connect the conductive pad 210A to the second end 2301 of the conductive through via 230. In some embodiments, the center of the second end 2301 of the conductive through via 230 is misaligned with at least one of the electrical contacts 50. In some embodiments, the stop layer 210 may serve as a fan-out structure.

FIG. 3A, FIG. 3B, FIG. 3C, FIG. 3D, FIG. 3E, FIG. 3F, FIG. 3G, and FIG. 3H illustrate various stages of a method of manufacturing a interposer 20 according to some embodiments of the present disclosure.

Figure 3A:
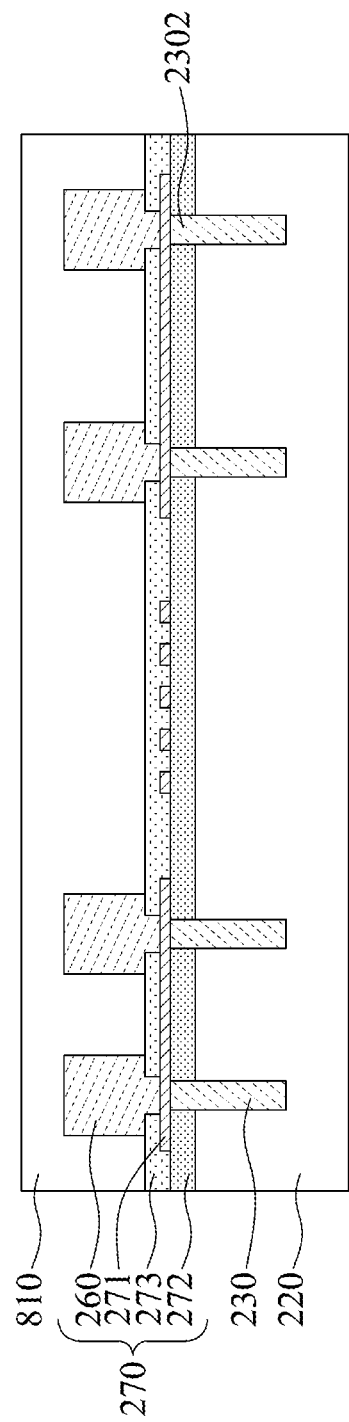
FIG. 3A, FIG. 3B, FIG. 3C, FIG. 3D, FIG. 3E, FIG. 3F, FIG. 3G, and FIG. 3H illustrate various stages of a method of manufacturing a interposer according to some embodiments of the present disclosure.

Referring to FIG. 3A, one or more conductive vias 230 may be formed in a main body 220. In some embodiments, a conductive structure 270 including a conductive layer 271, a first passivation layer 272, and a second passivation layer 273 is formed on the main body 220. In some embodiments, end portions 2302 (also referred to as "second end portions") of the conductive through vias 230 may extend through the first passivation layer 272 to contact the conductive layer 271. Interconnectors 260 may be formed to extend through the second passivation layer 273 to electrically connect to the conductive layer 271 of the conductive structure 270. In some embodiments, a carrier 810 may be disposed on and covering the interconnectors 260 and the conductive structure 270. The carrier 810 may include a tape or a coating layer.

Figure 3B:
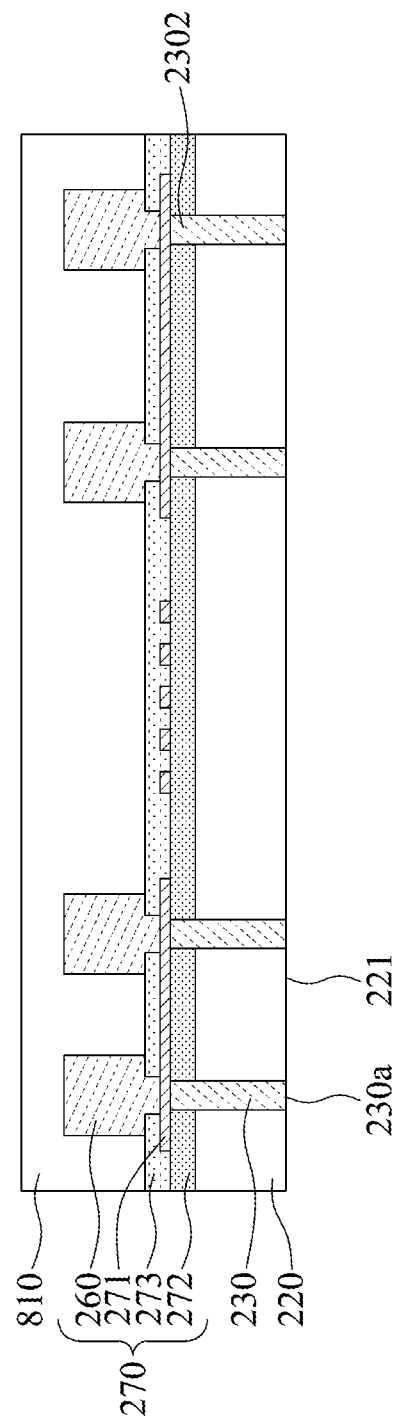

Referring to FIG. 3B, a portion of the main body 220 may be removed to expose surfaces 230a (also referred to as "bottom surfaces") of the conductive through vias 230 by a chemical mechanical polishing (CMP) operation. In some embodiments, the CMP operation is performed with a slurry having a grain size smaller than a grain size of a slurry for a grinding operation. The surface 230a of the conducive through via 230 may be substantially aligned with or coplanar with the second surface 221 of the main body 220.

Figure 3C:
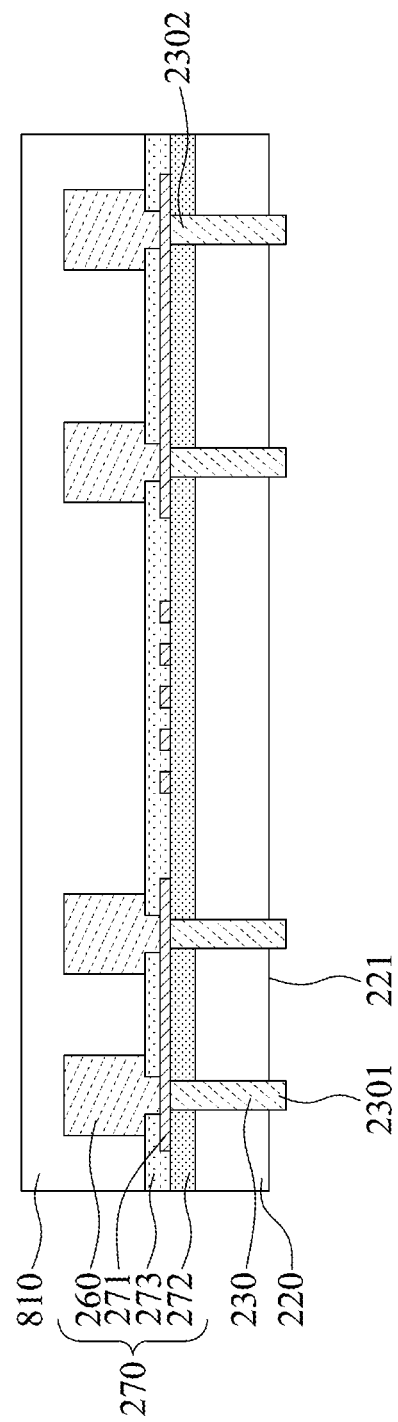

Referring to FIG. 3C, a portion of the main body 220 may be further removed to expose first end portions 2301 of the conductive through vias 230. In some embodiments, the first end portions 2301 are protruded from the second surface 221 of the main body 220. An etching operation may be performed on the main body 220 to expose the first end portions 2301 of the conductive through vias 230.

Figure 3D:
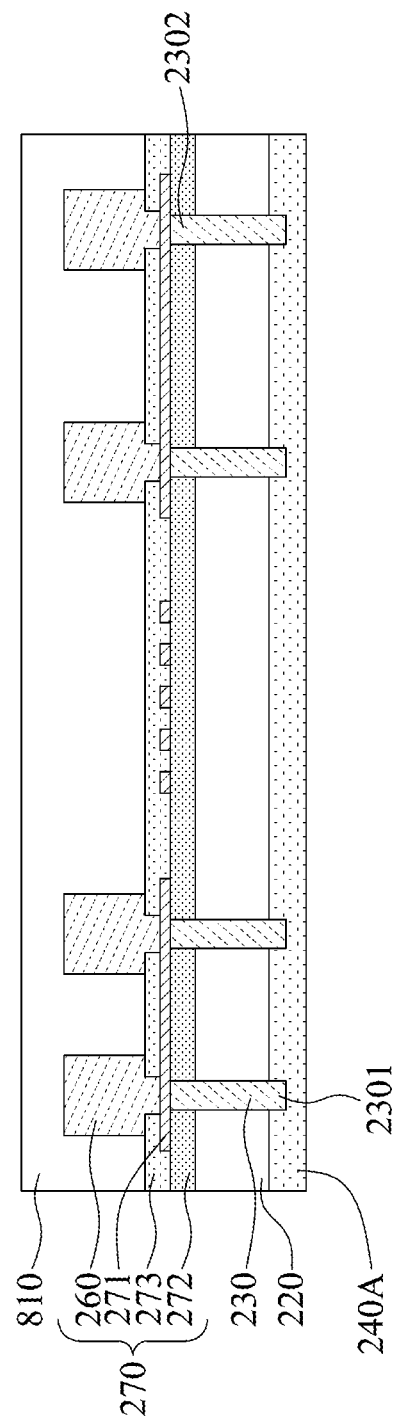

Referring to FIG. 3D, a dielectric layer 240A may be formed on the end portions 2301 of the conductive through vias 230 and the second surface 221 of the main body 220. In some embodiments, the dielectric layer 240A covers the first end portions 2301 of the conductive through vias 230.

Figure 3E:
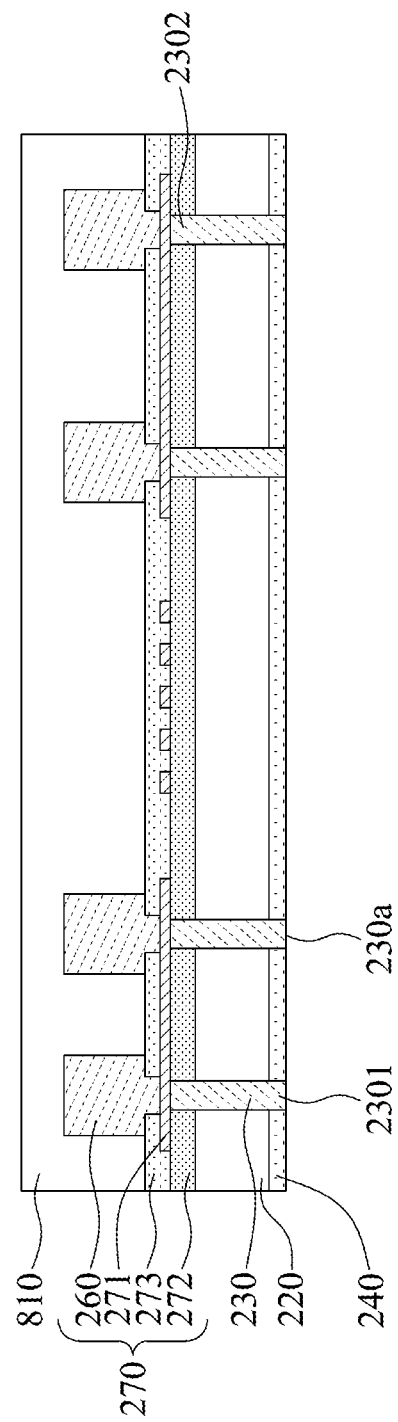

Referring to FIG. 3E, a portion of the dielectric layer 240A may be removed to form a dielectric layer 240. In some embodiments, a CMP operation may be performed on the dielectric layer 240A to expose the surfaces 230a of the conductive through vias 230.

Figure 3F:
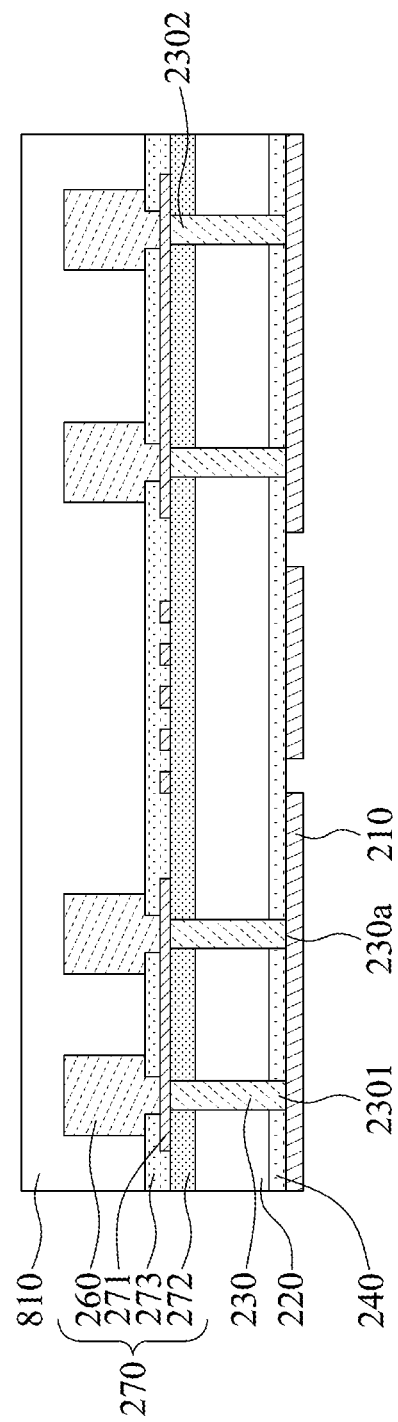

Referring to FIG. 3F, a stop layer 210 may be formed on the dielectric layer 240 to cover the first end portions 2301 of the conductive through vias 230. In some embodiments, the stop layer 210 is a patterned layer including a plurality of separated conductive pads 210A. The stop layer 210 may be formed by deposition (e.g., PVD) or plating. The pattern of the stop layer 210 may be formed by photolithography technique. In some embodiments, the second end 2301 of the conductive through via 230 may extend through the dielectric layer 240 to contact the stop layer 210.

Figure 3G:
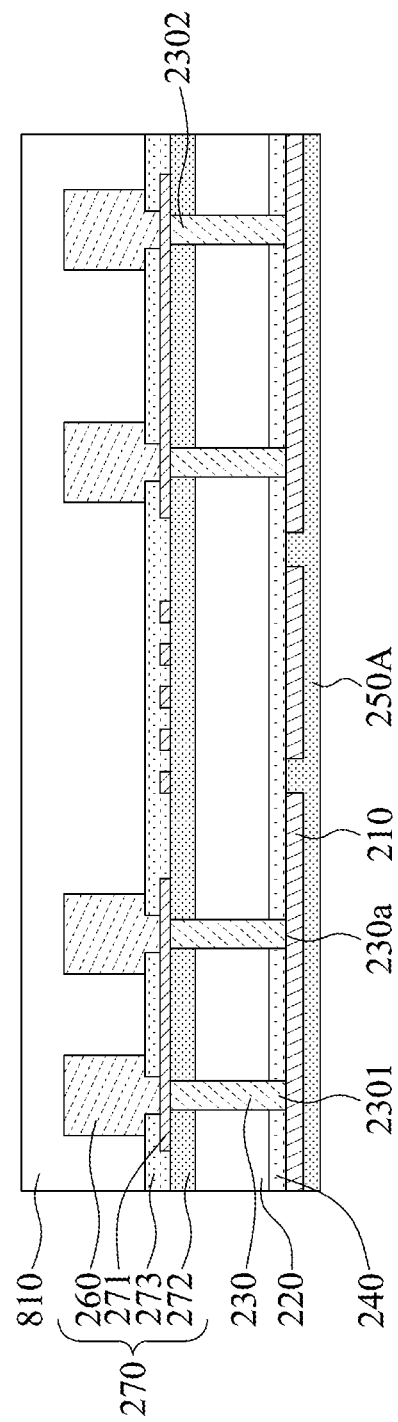

Referring to FIG. 3G, a dielectric layer 250A may be formed to cover the stop layer 210. In some embodiments, the dielectric layer 250A contacts the stop layer 210 and the dielectric layer 240.

Figure 3H:
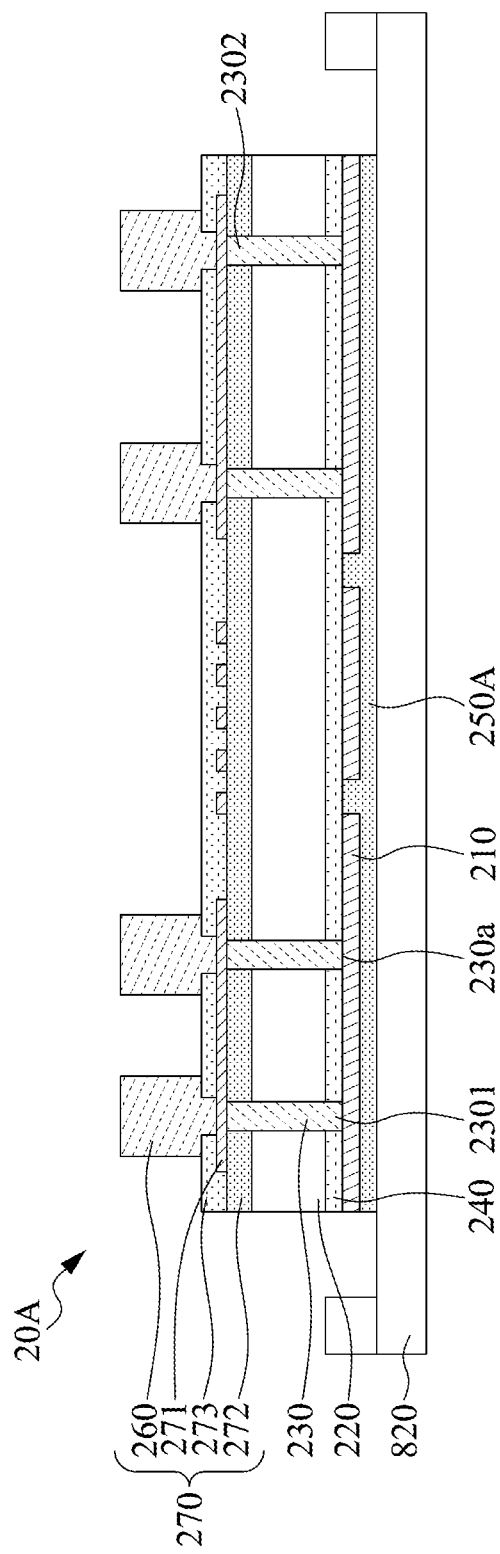

Referring to FIG. 3H, the structure shown in FIG. 3G may be flipped and disposed on a carrier 820 (e.g., a dicing tape), and the carrier 810 may be removed. In some embodiments, a singulation operation may be performed on the structure shown in FIG. 3G to form a plurality of interposers 20A. In some embodiments, the stop layer 210 is covered by the dielectric layer 250A of the interposer 20A. In some embodiments, the stop layer 210 may be disposed on the dielectric layer 240 and may be embedded in the dielectric layer 250A.

FIG. 4A, FIG. 4B, FIG. 4C, FIG. 4D, FIG. 4E, and FIG. 4F illustrate various stages of a method of manufacturing a package structure 1 according to some embodiments of the present disclosure.

Figure 4A:
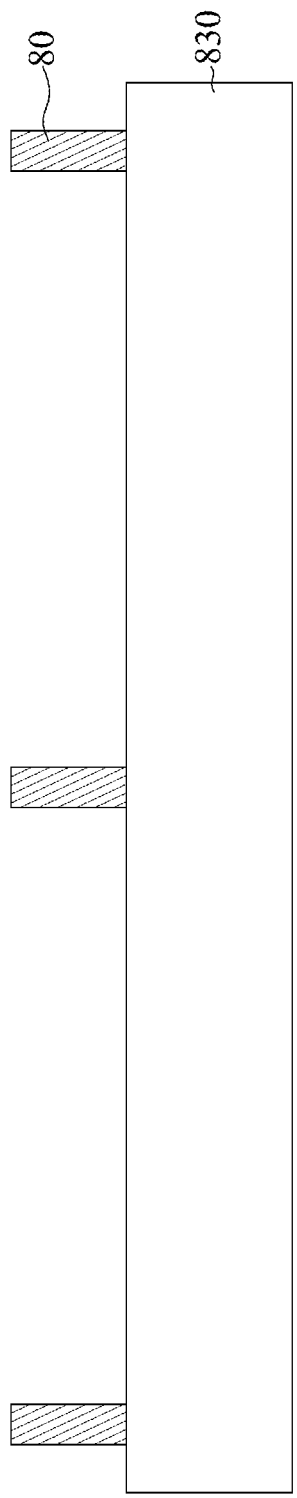
FIG. 4A, FIG. 4B, FIG. 4C, FIG. 4D, FIG. 4E, and FIG. 4F illustrate various stages of a method of manufacturing a package structure according to some embodiments of the present disclosure.

Referring to FIG. 4A, connection elements 80 are formed on a carrier 830. In some embodiments, the connection elements 80 may include conductive pillars.

Figure 4B:
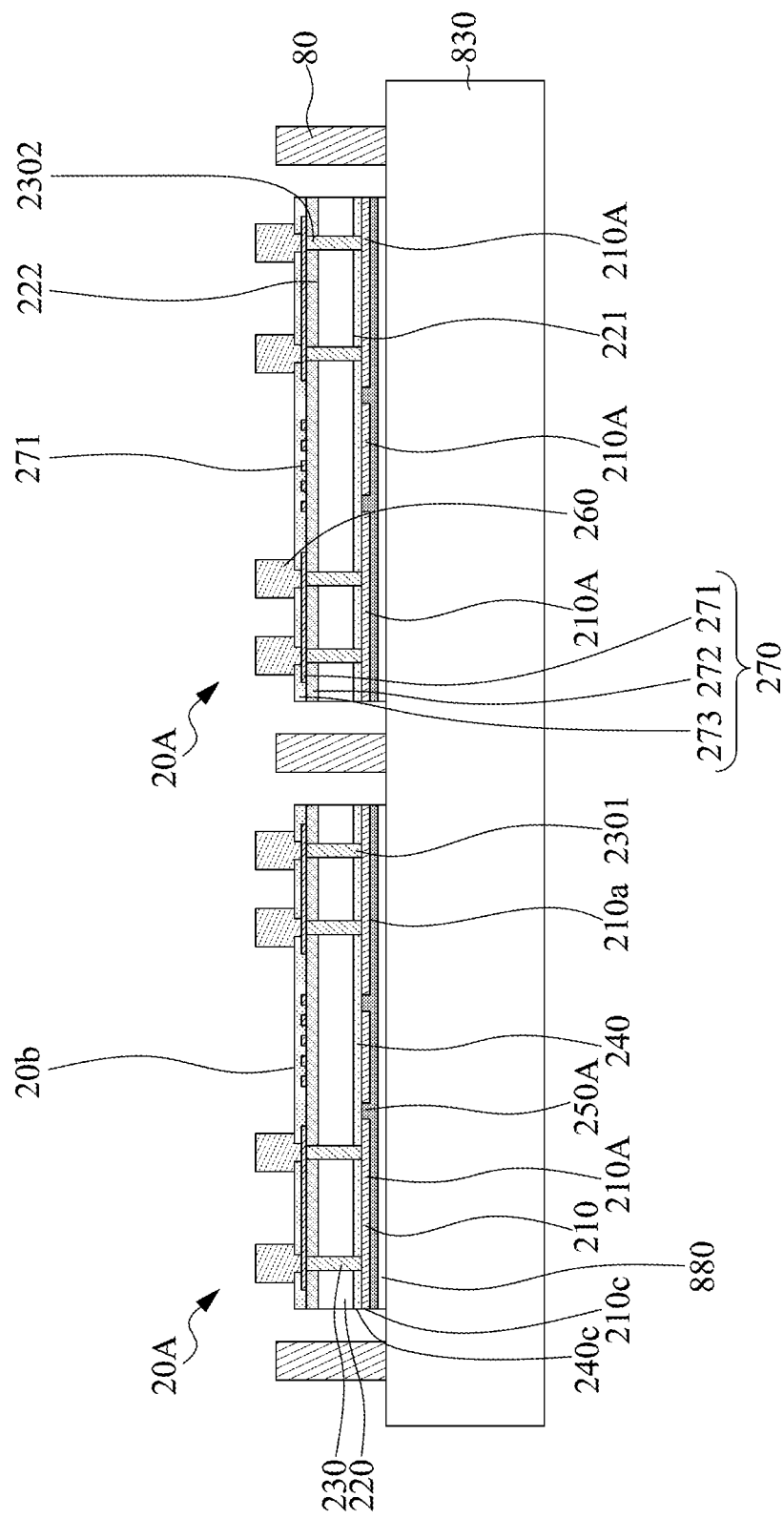

Referring to FIG. 4B, one or more interposer 20A may be disposed on the carrier 830. In some embodiments, the interposer 20A has a structure which is the same as or similar to the structure shown in FIG. 3H. In some embodiments, the interposer 20A includes a stop layer 210 facing the carrier 830. In some embodiments, the dielectric layer 250A of the interposer 20A is adhered to the carrier 830 through an adhesive layer 880.

Figure 4C:
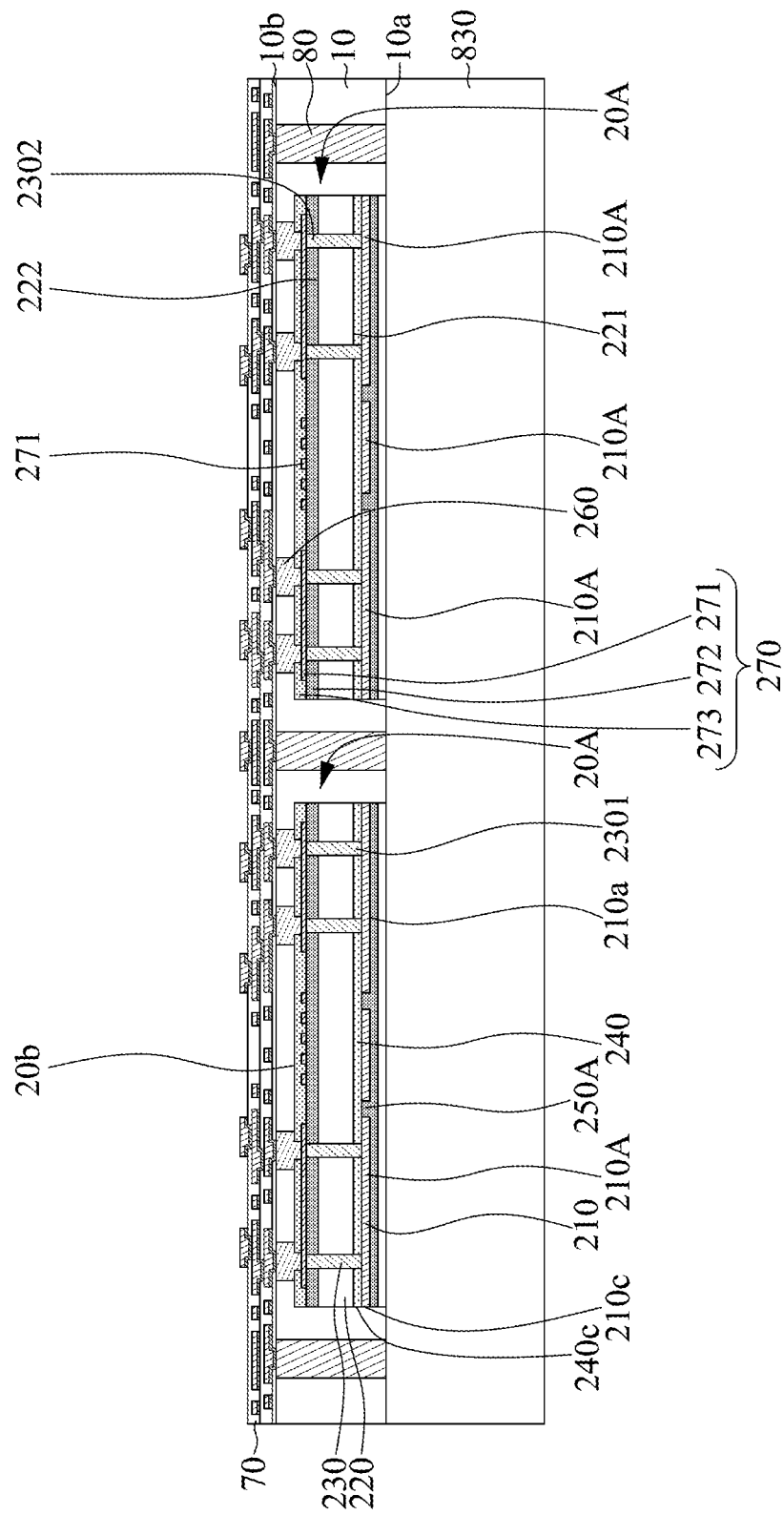

Referring to FIG. 4C, the interposers 20A may be encapsulated by an encapsulant 10, and a conductive structure 70 may be formed on the encapsulant 10 and the interposers 20A. In some embodiments, the conductive structure 70 is electrically connected to the interposers 20A and the connection elements 80. The conductive structure 70 may include a plurality of dielectric layers, at least one circuit layer and a plurality of inner vias electrically connected to the circuit layer. The circuit layer may include a seed layer and a metallic layer disposed on the seed layer. The inner via may taper toward the interposer 20A. That is, a width of the inner via may decrease toward the interposer 20A. The conductive element 80 may extend through the encapsulant 10 and may be disposed around the interposer 20A.

Figure 4D:
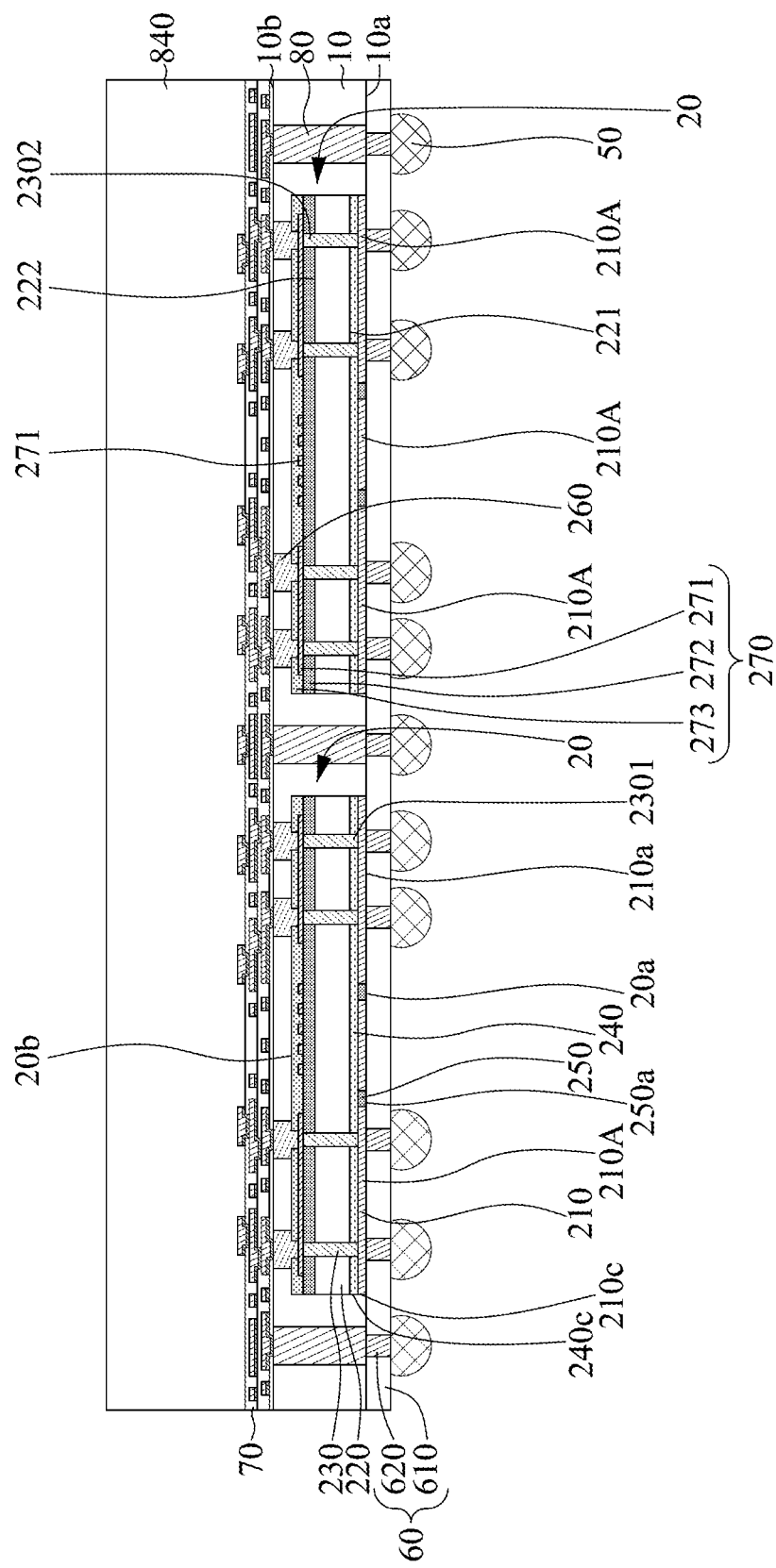

Referring to FIG. 4D, the carrier 830 may be removed, a carrier 840 may be disposed on the conductive structure 70, and a grinding operation may be performed on the interposer 20A to form a thinned interposer 20. In some embodiments, the grinding operation includes removing a portion of the encapsulant 10 and a portion of the dielectric layer 250A. In some embodiments, the grinding operation includes removing a portion of connection elements 80. In some embodiments, the grinding operation includes removing the adhesive layer 880. In some embodiments, the grinding operation may be performed from the surface 20a (or the bottom surface) of the interposer 20A to expose the stop layer 210 from the surface 20a of the interposer 20. In some embodiments, the grinding operation is performed with a slurry having a grain size larger than a grain size of a slurry for a CMP operation. In some embodiments, a ratio of a grain size of the slurry of the grinding operation to a grain size of the slurry of the CMP operation is from about 10 to about 15.

According to some embodiments of the present disclosure, with the arrangement of the stop layer 210, the main body 220 and the conductive through vias 230 can be protected from damages during the grinding operation. In addition, cracks of the interposer 20 (e.g., the main body 220) which could have been caused by the grinding operation can be mitigated or prevented.

Next, still referring to FIG. 4D, a conductive structure 60 may be formed on the stop layer 210 after performing the grinding operation, and a plurality of electrical contacts 50 may be disposed on the conductive structure 60.

Figure 4E:
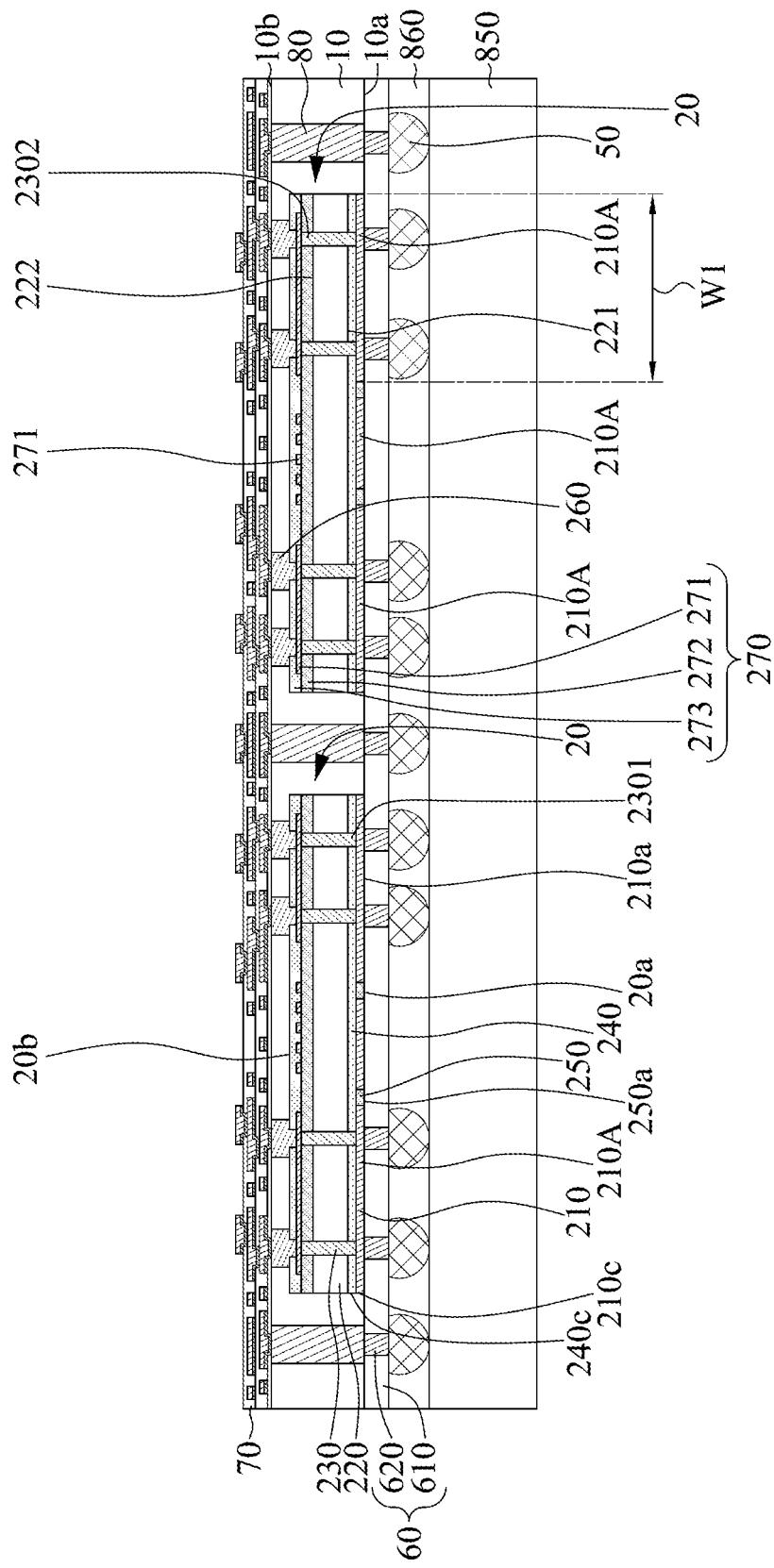

Referring to FIG. 4E, the carrier 840 may be removed, and a carrier 850 may be disposed on the electrical contacts 50. In some embodiments, a buffer layer 860 may be formed between the electrical contacts 50 and the carrier 850.

Figure 4F:
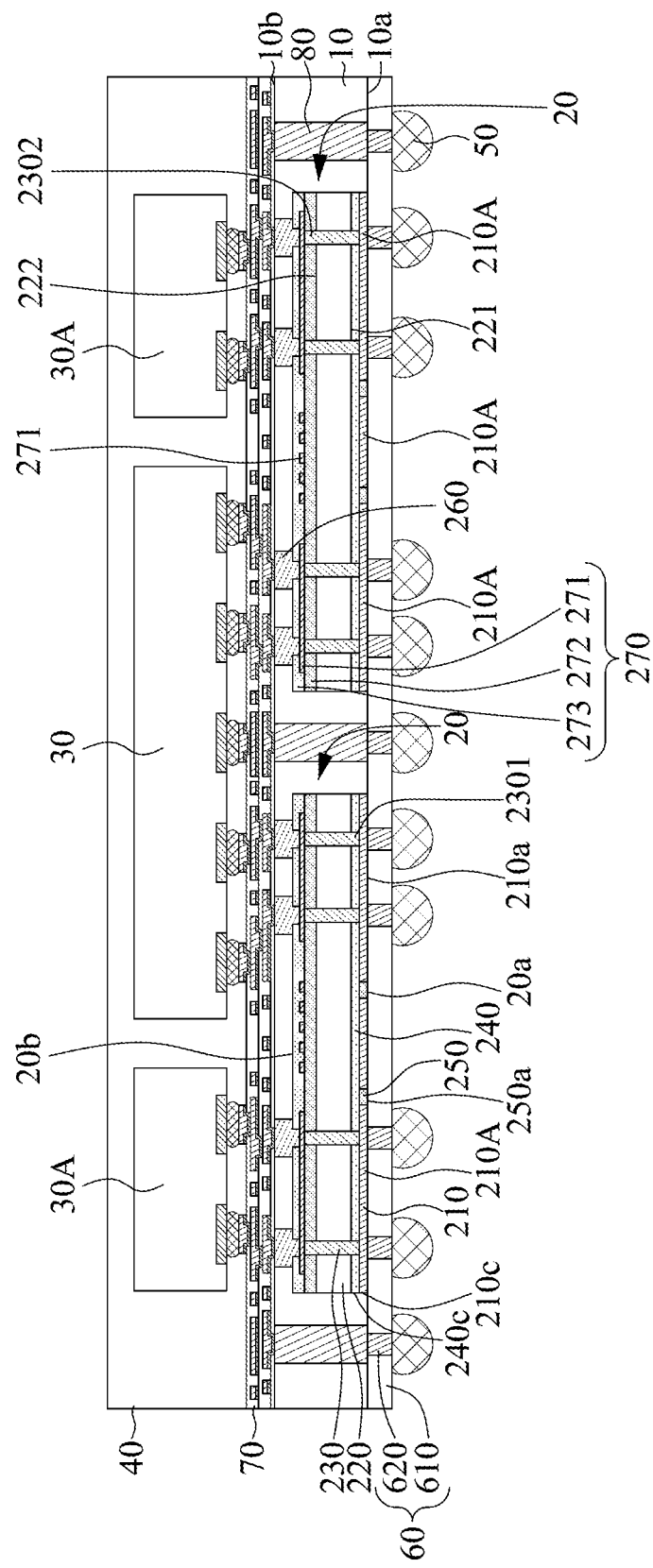

Referring to FIG. 4F, electronic components 30 and 30A may be disposed outside of the encapsulant 10 and electrically connected to the interposers 20 through the conductive structure 70, and an encapsulant 40 may be formed on the conductive structure 70 to encapsulate the electronic components 30 and 30A. The encapsulant 40 and the encapsulant 10 may include the same or different materials. In some embodiments, the electronic components 30 and 30A are disposed on the conductive structure 70. In some embodiments, the conductive structure 70 electrically connects the interposers 20 to the electronic components 30 and 30A. In some embodiments, a singulation process is conducted, and the carrier 850 and the buffer layer 860 are removed. As such, the package structure 1 illustrated in FIG. 1 is formed.

Figure 5A:
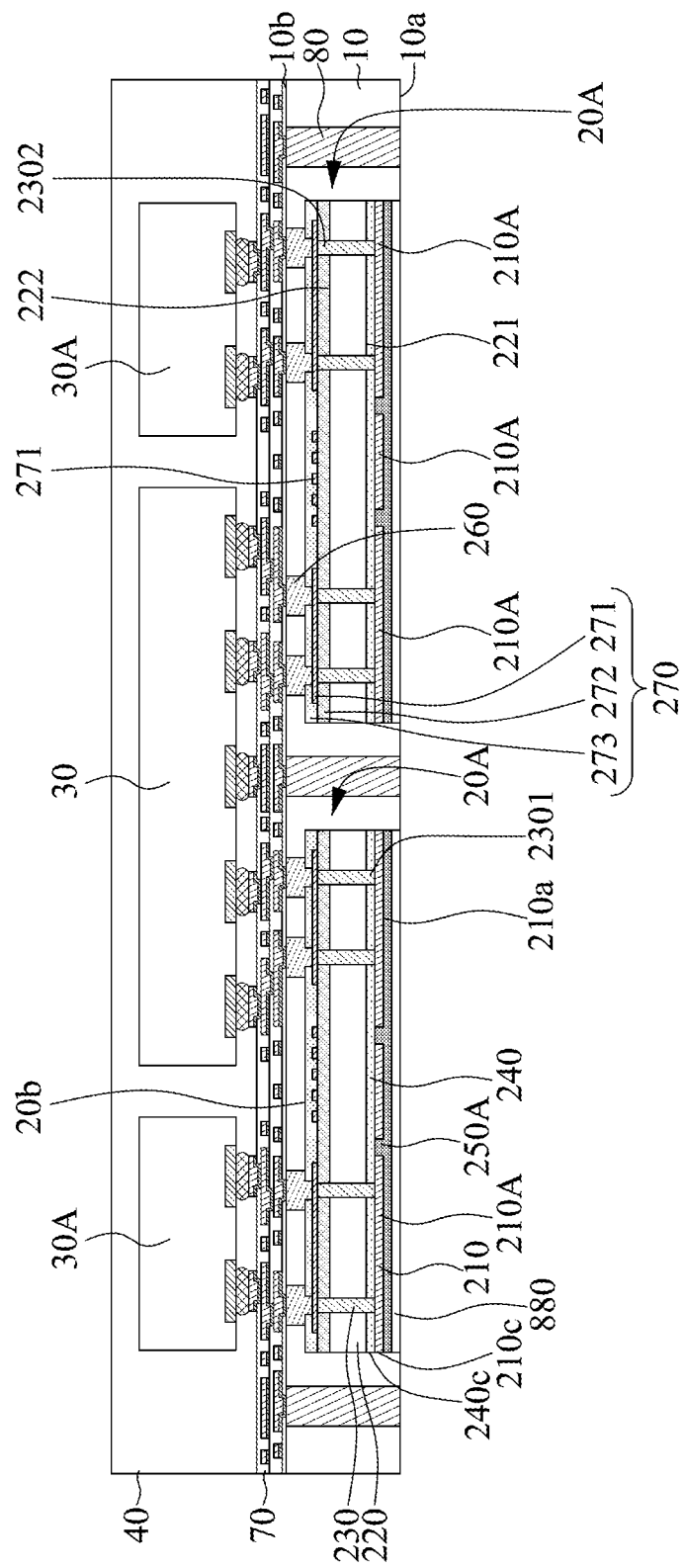
FIG. 5A, FIG. 5B, and FIG. 5C illustrate various stages of a method of manufacturing a package structure according to some embodiments of the present disclosure.
Figure 5B:
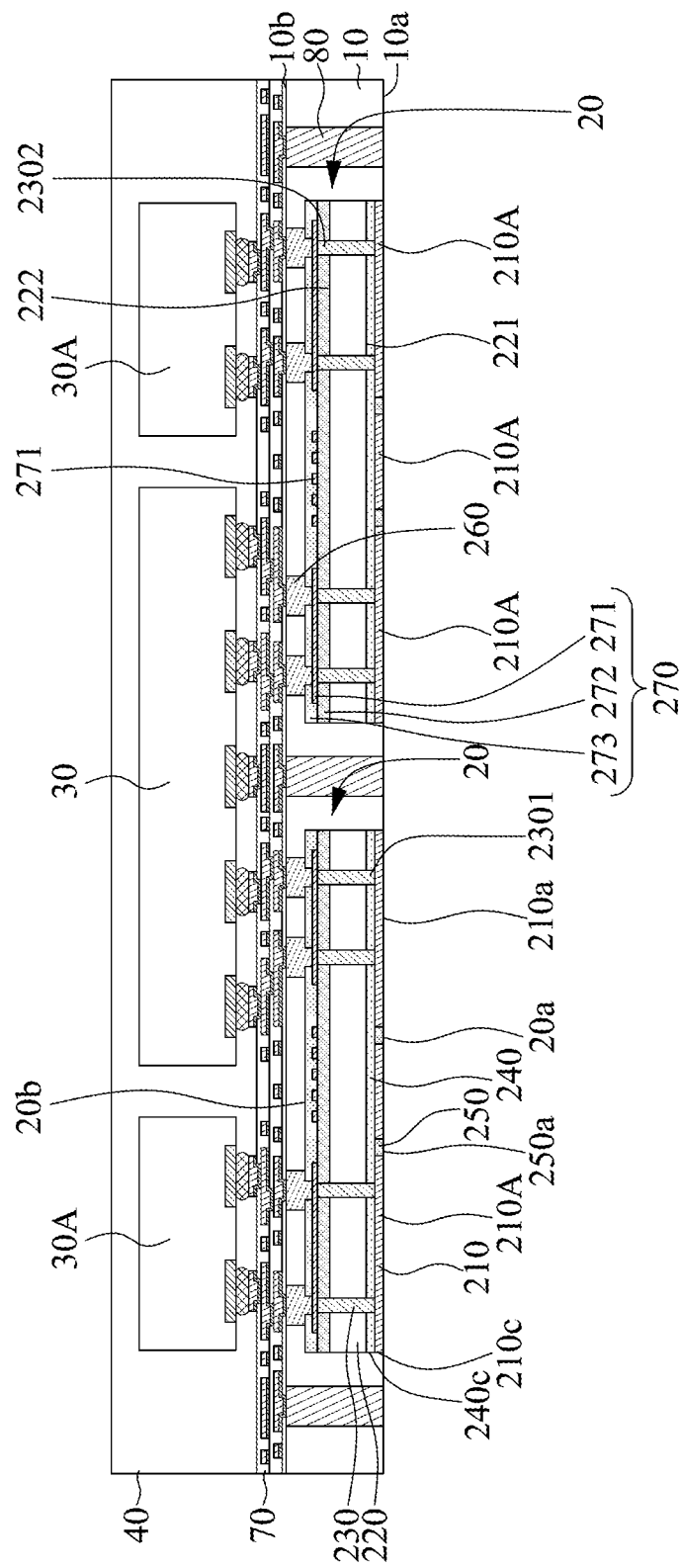
Figure 5C:
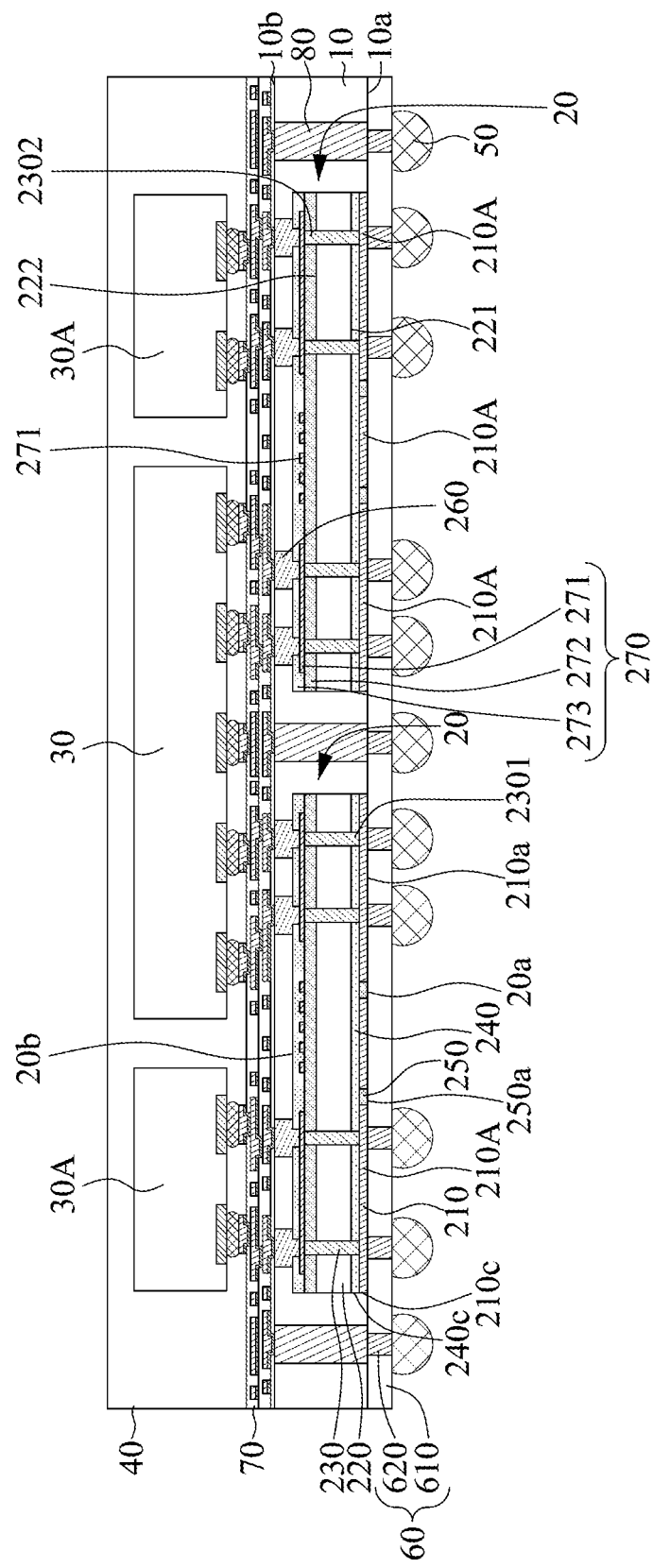

FIG. 5A, FIG. 5B, and FIG. 5C illustrate various stages of a method of manufacturing a package structure 1 according to some embodiments of the present disclosure.

The initial stages of the illustrated process are the same as, or similar to, the stages illustrated in FIGS. 4A-4C. FIG. 5A depicts a stage subsequent to that depicted in FIG. 4C.

Referring to FIG. 5A, electronic components 30 and 30A may be disposed outside of the encapsulant 10 and electrically connected to the interposers 20 through the conductive structure 70, and an encapsulant 40 may be formed on the conductive structure 70 to encapsulate the electronic components 30 and 30A. In some embodiments, the electronic components 30 and 30A are disposed on the conductive structure 70. In some embodiments, the conductive structure 70 electrically connects the interposers 20 to the electronic components 30 and 30A.

Referring to FIG. 5B, a grinding operation may be performed on the interposer 20A to form a thinned interposer 20. In some embodiments, the grinding operation includes removing a portion of the encapsulant 10 and a portion of the dielectric layer 250A. In some embodiments, the grinding operation includes removing a portion of connection elements 80. In some embodiments, the grinding operation includes removing the adhesive layer 880. In some embodiments, the grinding operation may be performed from the bottom surface of the interposer 20A to expose the stop layer 210 from the surface 20a of the interposer 20. In some embodiments, the grinding operation is performed with a slurry having a grain size larger than a grain size of a slurry for a CMP operation. In some embodiments, a ratio of a grain size of the slurry of the grinding operation to a grain size of the slurry of the CMP operation is from about 10 to about 15.

Referring to FIG. 5C, a conductive structure 60 may be formed on the bottom surface 10a of the encapsulant 10 and on the stop layer 210 after performing the grinding operation, and a plurality of electrical contacts 50 may be disposed on the conductive structure 60. As such, the package structure 1 illustrated in FIG. 1 is formed.

FIG. 6A, FIG. 6B, FIG. 6C, and FIG. 6D illustrate various stages of a method of manufacturing a package structure 1B according to some embodiments of the present disclosure.

Figure 6A:
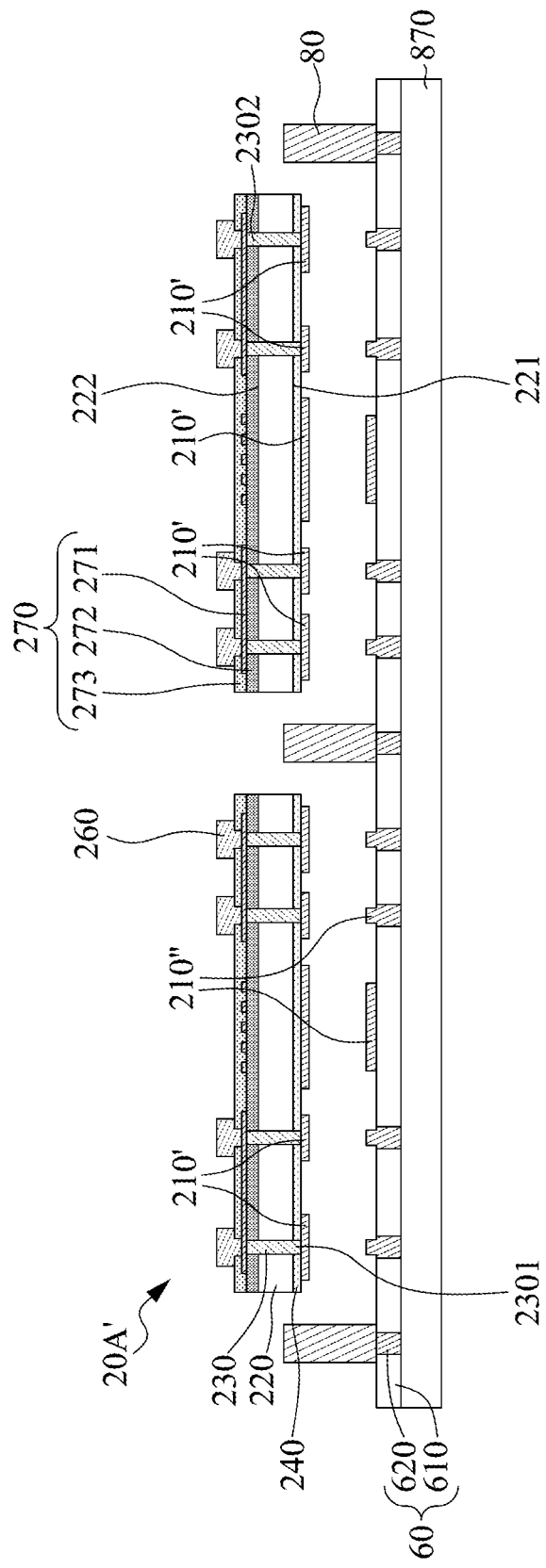
FIG. 6A, FIG. 6B, FIG. 6C, and FIG. 6D illustrate various stages of a method of manufacturing a package structure according to some embodiments of the present disclosure.

Referring to FIG. 6A, a conductive structure 60 may be formed on a carrier 870, connection elements 80 and connection pads 210" may be formed on the conductive structure 60, and operations similar to those illustrated in FIGS. 3A-3F may be performed to form a interposer 20A' as shown in FIG. 6A.

Figure 6B:
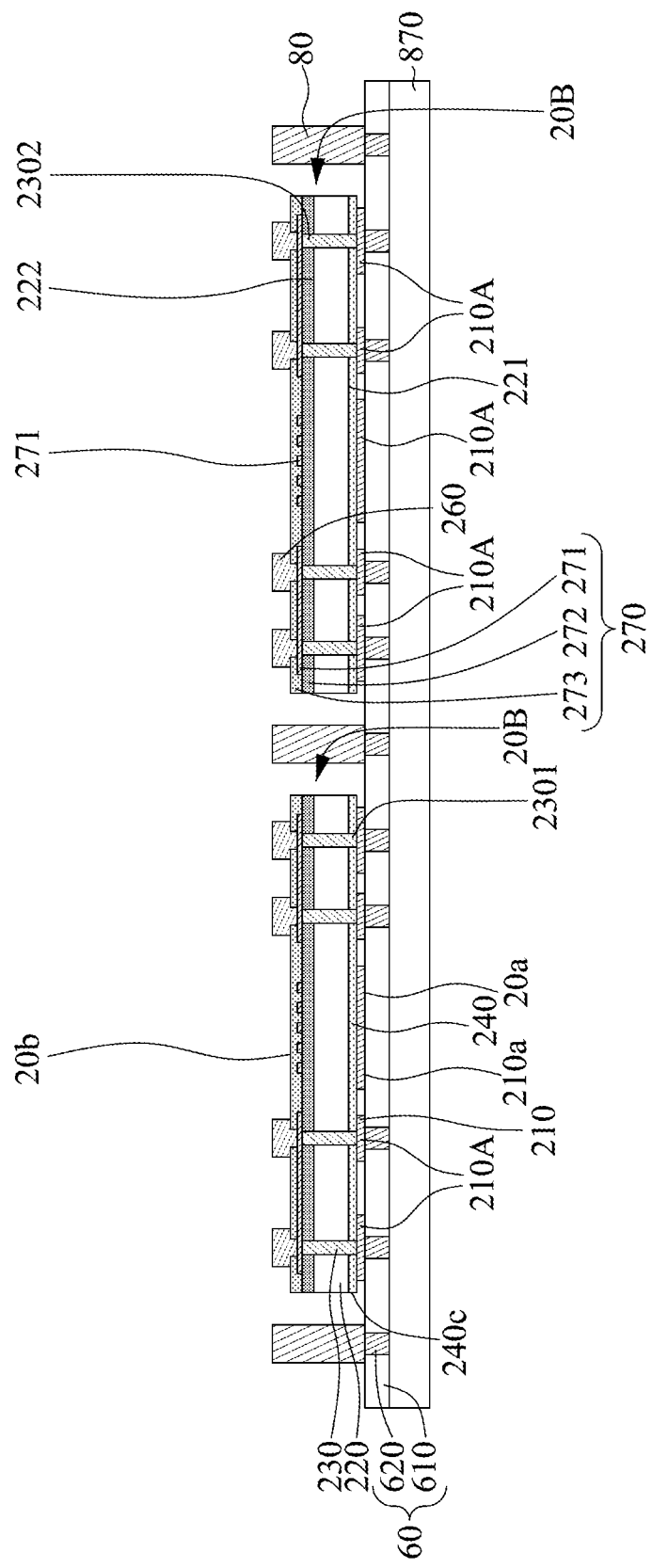

Referring to FIG. 6B, the interposers 20A' may be bonded to the conductive structure 60. In some embodiments, the connection pads 210' of the interposers 20A' are bonded to the connection pads 210" on the conductive structure 60 to form an interconnector (e.g., the stop layer 210) between the as-formed interposers 20B and the conductive structure 60. In some embodiments, the connection pads 210' of the interposers 20A' are bonded to the connection pads 210" on the conductive structure 60 through a thermal compression bonding operation.

Figure 6C:
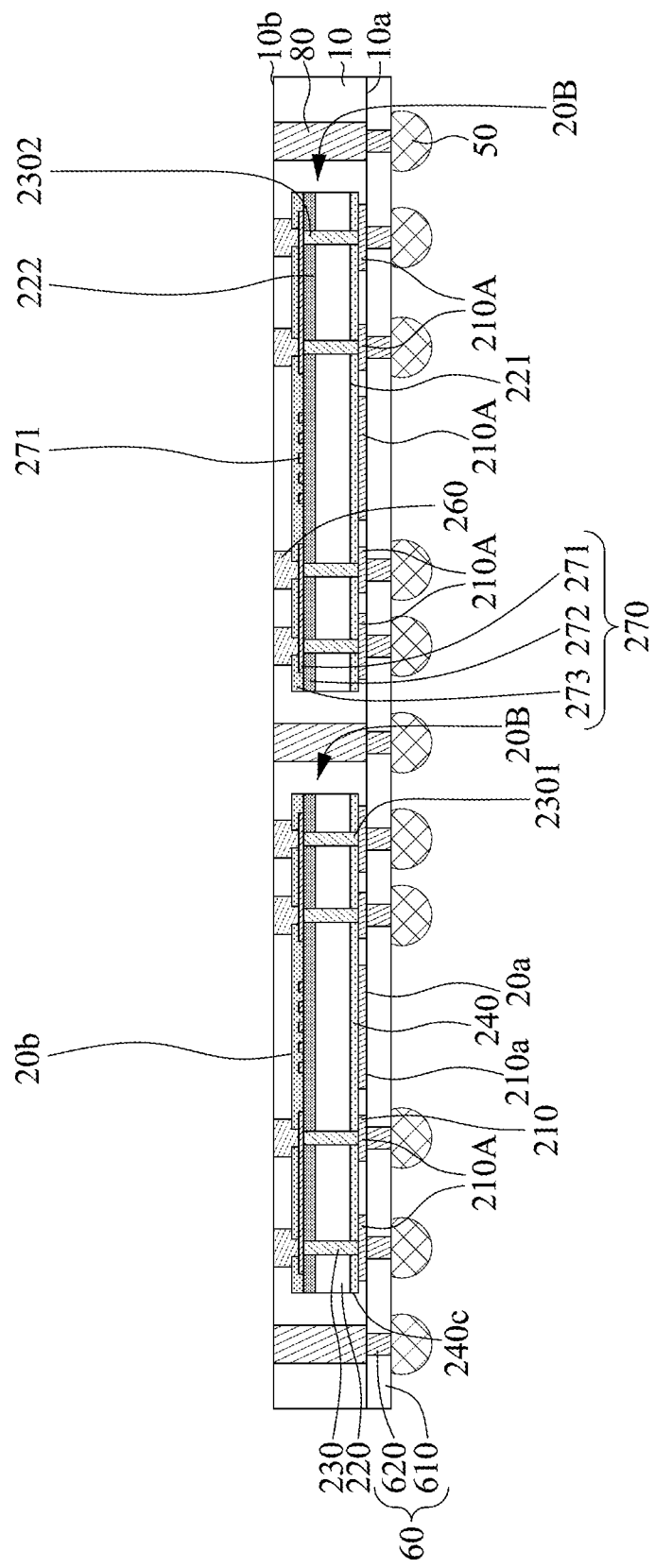

Referring to FIG. 6C, an encapsulant 10 may be formed to encapsulate the interposers 20B and the connection elements 80. Then, the carrier 870 is removed, and electrical contacts 50 may be formed on the conductive structure 60. In some embodiments, the encapsulant 10 may cover the interposers 20B and the connection elements 80, and then a grinding operation is performed on the encapsulant 10, the interconnectors 260 of the interposers 20B, and the connection elements 80 to exposed the interconnectors 260 of the interposers 20B and the connection elements 80 from the encapsulant 10.

Figure 6D:
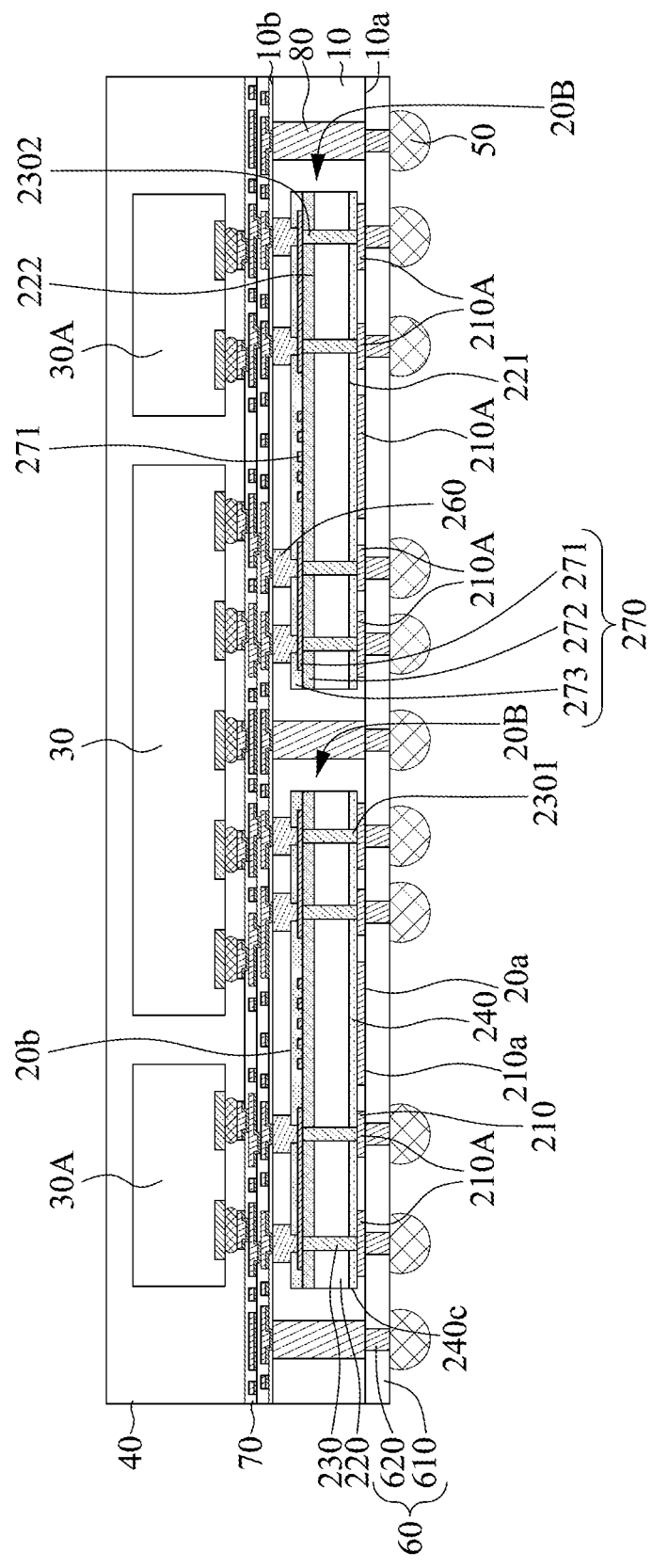

Referring to FIG. 6D, electronic components 30 and 30A may be disposed outside of the encapsulant 10 and electrically connected to the interposers 20B through the conductive structure 70, and an encapsulant 40 may be formed on the conductive structure 70 to encapsulate the electronic components 30 and 30A. In some embodiments, the electronic components 30 and 30A are disposed on the conductive structure 70. In some embodiments, the conductive structure 70 electrically connects the interposers 20B to the electronic components 30 and 30A. As such, the package structure 1B illustrated in FIG. 1B is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   an encapsulant having a top surface and a bottom surface opposite to the top surface;
   a main body encapsulated by the encapsulant and having a first surface and a second surface opposite to the first surface;
   an interconnector disposed over the first surface of the main body;
   a metal layer adjacent to the second surface of the main body, wherein the metal layer has a surface substantially aligned with the bottom surface of the encapsulant;

a first dielectric layer laterally covering the metal layer and encapsulated by the encapsulant; and a first electronic component and a second electronic component electrically connected to the first electronic component by the main body, wherein the first surface of the main body faces the first electronic component and the second electronic component.

2. The package structure of claim 1, wherein a bottom surface of the first dielectric layer is exposed by the encapsulant.

3. The package structure of claim 2, wherein the bottom surface of the first dielectric layer is substantially aligned with the bottom surface of the encapsulant.

4. The package structure of claim 3, wherein the surface of the metal layer is substantially aligned with the bottom surface of the first dielectric layer.

5. The package structure of claim 3, wherein a lateral surface of the first dielectric layer, which contacts the encapsulant, is substantially aligned with a lateral surface of the main body.

6. The package structure of claim 1, further comprising:
a conductive structure disposed under the first dielectric layer and electrically connected to the metal layer.

7. The package structure of claim 6, wherein the conductive structure comprises a second dielectric layer and a conductive element within the second dielectric layer, and the second dielectric layer contacts the metal layer.

8. The package structure of claim 1, further comprising:
a conductive pillar encapsulated by the encapsulant and spaced apart from the first dielectric layer.

9. The package structure of claim 8, wherein a bottom surface of the conductive pillar is substantially aligned with a bottom surface of the first dielectric layer.

10. A package structure, comprising:
a first encapsulant having a top surface and a bottom surface opposite to the top surface;
an interposer encapsulated by the first encapsulant, comprising:
a through via within the interposer; and
a dielectric layer laterally covering the through via and encapsulated by the first encapsulant; and
a plurality of electronic components facing the top surface of the first encapsulant,
wherein the dielectric layer has a bottom surface exposed by the first encapsulant.

11. The package structure of claim 10,
wherein the interposer is configured to transmit an electrical signal between the plurality of electronic components.

12. The package structure of claim 11, further comprising:
a second encapsulant encapsulating the plurality of electronic components and spaced apart from the first encapsulant.

13. The package structure of claim 10, wherein a bottom surface of the through via is substantially aligned with the bottom surface of the dielectric layer.

14. A package structure, comprising:
an encapsulant having a top surface and a bottom surface opposite to the top surface;
a main body encapsulated by the encapsulant and having a first surface and a second surface opposite to the first surface;
an interconnector disposed over the first surface;
a metal layer under the second surface;
an electronic component facing the first surface of the main body; and
a dielectric layer adjacent to the second surface of the main body, wherein a bottom surface of the dielectric layer is substantially aligned with the bottom surface of the encapsulant and a bottom surface of the metal layer.

15. The package structure of claim 14, wherein a top surface of the interconnector is substantially aligned with the top surface of the encapsulant.

16. The package structure of claim 14, further comprising:
a through via penetrating the main body, wherein the dielectric layer laterally overlaps a portion of the through via and is free from laterally overlapping the main body.

17. The package structure of claim 1, wherein a thickness of the metal layer is substantially equal to a thickness of the first dielectric layer.

18. The package structure of claim 10, wherein the dielectric layer contacts a portion of a lateral surface of the through via.

19. The package structure of claim 10, further comprising:
a metal layer connected to the through via,
wherein the dielectric layer contacts the metal layer.

* * * * *